United States Patent
Wu et al.

(10) Patent No.: US 11,960,318 B2
(45) Date of Patent: Apr. 16, 2024

(54) CLOCK OSCILLATOR AND CLOCK OSCILLATOR PRODUCTION METHOD

(71) Applicant: HUAWEI TECHNOLOGIES CO., LTD., Shenzhen (CN)

(72) Inventors: Wei Wu, Wuhan (CN); Jinhui Wang, Dongguan (CN); Hao Li, Dongguan (CN); Yong Yang, Xi'an (CN); Xinhua Huang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 225 days.

(21) Appl. No.: 17/529,823

(22) Filed: Nov. 18, 2021

(65) Prior Publication Data
US 2022/0171424 A1    Jun. 2, 2022

(30) Foreign Application Priority Data

| Nov. 30, 2020 | (CN) | 202011386388.5 |
| Jan. 26, 2021 | (CN) | 202110106739.0 |
| Jun. 23, 2021 | (CN) | 202110698159.5 |

(51) Int. Cl.
  G04F 5/06 (2006.01)
  G06F 1/04 (2006.01)
  H03B 5/32 (2006.01)
  (Continued)

(52) U.S. Cl.
  CPC ............... *G06F 1/04* (2013.01); *G04F 5/063* (2013.01); *H03B 5/32* (2013.01); *H03H 9/09* (2013.01); *H03H 9/215* (2013.01)

(58) Field of Classification Search
  CPC ... G04F 5/04; G04F 5/06; G04F 5/063; G06F 1/04; H03B 5/30; H03B 5/32;
  (Continued)

(56) References Cited

U.S. PATENT DOCUMENTS

| 4,267,479 | A | * | 5/1981 | Kato | H03H 9/17 310/351 |
| 5,406,682 | A | * | 4/1995 | Zimnicki | H03H 9/09 29/25.35 |

(Continued)

FOREIGN PATENT DOCUMENTS

| CH | 706745 A2 | 1/2014 |
| JP | H08125440 A | 5/1996 |

(Continued)

OTHER PUBLICATIONS

El Moumen et al., "Carbon nanotubes as a player to improve mechanical shock wave absorption", Composites Part B, vol. 164, Nov. 16, 2018, 6 pages.

*Primary Examiner* — Levi Gannon
(74) *Attorney, Agent, or Firm* — Maier & Maier, PLLC

(57) ABSTRACT

A clock oscillator, a clock oscillator production method and use method, and a chip including the clock oscillator are provided. The clock oscillator includes a resonator, a shock-absorbing material layer, and a base, and at least a part of the shock-absorbing material layer is located between the resonator and the base. In the clock oscillator, the shock-absorbing material layer is added between the resonator and the base, and the shock-absorbing material layer can effectively prevent a mechanical wave from being conducted between the base and the resonator, so that the resonator is protected from external vibration. This can ensure, when there is external vibration, that an output frequency of the resonator is not deteriorated and improve shock absorption performance of the clock oscillator.

25 Claims, 16 Drawing Sheets

(51) Int. Cl.
*H03H 9/09* (2006.01)
*H03H 9/215* (2006.01)

(58) Field of Classification Search
CPC .......... H03B 5/323; H03B 5/326; H03B 5/34; H03B 5/36; H03B 5/362; H03B 5/364; H03B 5/366; H03B 5/368; H03H 9/0538; H03H 9/09; H03H 9/215
See application file for complete search history.

(56) References Cited

U.S. PATENT DOCUMENTS

| | | | |
|---|---|---|---|
| 2004/0241440 A1* | 12/2004 | Noguchi | C08J 5/005 428/292.1 |
| 2005/0090222 A1 | 4/2005 | Knecht et al. | |
| 2007/0035214 A1* | 2/2007 | Kasahara | H03H 9/0514 310/348 |
| 2008/0265717 A1* | 10/2008 | Iizuka | H03H 9/1021 310/348 |
| 2014/0016443 A1* | 1/2014 | Klopfenstein | G04F 5/06 368/168 |
| 2017/0307040 A1 | 10/2017 | Schaedler et al. | |
| 2018/0342981 A1* | 11/2018 | Kondo | H03H 9/1014 |
| 2019/0341885 A1 | 11/2019 | Jackson et al. | |
| 2020/0067454 A1* | 2/2020 | Kikushima | H03H 9/1021 |

FOREIGN PATENT DOCUMENTS

| | | |
|---|---|---|
| JP | 2005150971 A | 6/2005 |
| JP | 2007049426 A | 2/2007 |
| JP | 2008205273 A | 9/2008 |
| JP | 2011160176 A | 8/2011 |
| JP | 2014013767 A | 1/2014 |
| JP | 2019509909 A | 4/2019 |
| JP | 2020123874 A | 8/2020 |

* cited by examiner

US 11,960,318 B2

CLOCK OSCILLATOR AND CLOCK OSCILLATOR PRODUCTION METHOD

CROSS-REFERENCE TO RELATED APPLICATIONS

This application claims priority to Chinese Patent Application No. 202011386388.5, filed on Nov. 30, 2020, and Chinese Patent Application No. 202110106739.0, filed on Jan. 26, 2021, and Chinese Patent Application No. 202110698159.5, filed on Jun. 23, 2021. All of the aforementioned applications are hereby incorporated by reference in their entireties.

TECHNICAL FIELD

The embodiments relate to the field of computers, and in particular, to a clock oscillator with a shock absorption capability, a clock oscillator production method and use method, and a chip including the clock oscillator.

BACKGROUND

A clock oscillator is an important component in an electronic system and provides a necessary clock frequency for the electronic system, so that the electronic system can perform various operations at the clock frequency to implement normal operation. The clock oscillator usually includes modules such as an electrical/mechanical resonator, a feedback network, an amplification network, and an output network. A resonance characteristic of the circuit/mechanical resonator is used to select a frequency, to generate a periodically oscillating frequency signal, namely, a clock signal.

When vibration of an external environment is transferred to the resonator, hopping of an output frequency of the resonator may be caused. Consequently, due to instability of the clock signal, performance of the entire electronic system is deteriorated, and a bit error occurs. Therefore, shock absorption performance is an important performance indicator of the clock oscillator, and how to improve the shock absorption performance of the clock oscillator is a technical problem that urgently needs to be resolved.

SUMMARY

A clock oscillator is provided to resolve a problem of poor shock absorption performance of a clock oscillator.

According to a first aspect, a clock oscillator is provided. The clock oscillator includes a resonator, a shock-absorbing material layer, and a base, and at least a part of the shock-absorbing material layer is located between the resonator and the base.

In the clock oscillator, the shock-absorbing material layer is added between the resonator and the base, and the shock-absorbing material layer can effectively prevent a mechanical wave from being conducted between the base and the resonator, so that the resonator is protected from external vibration. This can ensure, when there is external vibration, that an output frequency of the resonator is not deteriorated and improve shock absorption performance of the clock oscillator.

In a possible implementation, the shock-absorbing material layer includes a micron-level layer structure, a nanometer-level three-dimensional mesh structure, or a polymer material.

In a possible implementation, the nanometer-level three-dimensional mesh structure includes nanofibers.

In a possible implementation, the nanofibers include carbon nanofibers and/or ceramic nanofibers.

Materials of these structures can form a shock-absorbing material layer with a thickness of tens of microns to hundreds of microns, to achieve high shock absorption performance with a quite small thickness and ensure small-size packaging. In addition, the materials of these structures have both high strength and high toughness, and therefore a difficulty that a material of a conventional structure can hardly have high strength and high toughness is overcome, and reliability is ensured. In addition, the materials of these structures can be produced by using a large-scale biological material synthesis method. This is cost-effective and supports large-scale manufacturing.

In a possible implementation, a structure of the shock-absorbing material layer includes a planar layer structure, the resonator is located on a first side of the shock-absorbing material layer, the base is located on a second side of the shock-absorbing material layer, and the second side of the shock-absorbing material layer is opposite to the first side of the shock-absorbing material layer.

In a possible implementation, the planar layer structure includes a continuous planar layer structure, a planar grid layer structure, or a plurality of dotted structures in a same plane.

In a possible implementation, a structure of the shock-absorbing material layer includes a curved layer structure, and the shock-absorbing material layer fully or half surrounds the resonator.

In a possible implementation, the curved layer structure includes a continuous curved layer structure or a curved grid layer structure.

In a possible implementation, surfaces of the resonator and the shock-absorbing material layer are bonded to implement a close connection between the resonator and the shock-absorbing material layer.

In a possible implementation, the clock oscillator further includes an integrated circuit (IC); and at least a part of the shock-absorbing material layer is located between the IC and the resonator, the shock-absorbing material layer is in contact with a first surface of the IC, a second surface of the IC is in contact with a first surface of the base, and the first surface of the IC is opposite to the second surface of the IC; or the shock-absorbing material layer is in contact with a first surface of the base, the IC is in contact with the first surface of the base, and the IC does not overlap the shock-absorbing material layer.

In a possible implementation, the resonator is a crystal resonator or a semiconductor resonator.

In a possible implementation, the crystal resonator is a crystal resonator on which surface mounted device (SMD) ceramic packaging is performed.

In a possible implementation, the semiconductor resonator is a semiconductor resonator on which wafer-level packaging is performed.

The resonator is packaged in advance, so that the shock-absorbing material layer can be disposed between the resonator and the base.

In a possible implementation, overall packaging is performed on the resonator and the shock-absorbing material layer through vacuum packaging or plastic packaging.

According to a second aspect, a clock oscillator production method is provided. The method includes: disposing at least a part of a shock-absorbing material layer between a resonator and a base; and performing overall packaging on the resonator and the shock-absorbing material layer to obtain a clock oscillator.

In the method, the shock-absorbing material layer is added between the resonator and the base, and the shock-absorbing material layer can effectively prevent a mechanical wave from being conducted between the base and the resonator, so that the resonator is protected from external vibration. This can ensure, when there is external vibration, that an output frequency of the resonator is not deteriorated and improve shock absorption performance of the clock oscillator.

In a possible implementation, the shock-absorbing material layer includes a micron-level layer structure, a nanometer-level three-dimensional mesh structure, or a polymer material.

In a possible implementation, the nanometer-level three-dimensional mesh structure includes nanofibers.

In a possible implementation, the nanofibers include carbon nanofibers and/or ceramic nanofibers.

Materials of these structures can form a shock-absorbing material layer with a thickness of tens of microns to hundreds of microns, to achieve high shock absorption performance with a quite small thickness and ensure small-size packaging. In addition, the materials of these structures have both high strength and high toughness, and therefore a difficulty that a material of a conventional structure can hardly have high strength and high toughness is overcome, and reliability is ensured. In addition, the materials of these structures can be produced by using a large-scale biological material synthesis method. This is cost-effective and supports large-scale manufacturing.

In a possible implementation, a structure of the shock-absorbing material layer includes a planar layer structure, and the disposing at least a part of a shock-absorbing material layer between a resonator and a base includes: placing the resonator on a first side of the shock-absorbing material layer; and placing the base on a second side of the shock-absorbing material layer, where the second side of the shock-absorbing material layer is opposite to the first side of the shock-absorbing material layer.

In a possible implementation, the planar layer structure includes a continuous planar layer structure, a planar grid layer structure, or a plurality of dotted structures in a same plane.

In a possible implementation, a structure of the shock-absorbing material layer is a curved layer structure, and the disposing at least a part of a shock-absorbing material layer between a resonator and a base includes: using the shock-absorbing material layer to fully or half surround the resonator.

In a possible implementation, the curved layer structure includes a continuous curved layer structure or a curved grid layer structure.

In a possible implementation, the disposing at least a part of a shock-absorbing material layer between to resonator and a base includes: bonding surfaces of the resonator and the shock-absorbing material layer to implement a close connection between the resonator and the shock-absorbing material layer.

In a possible implementation, the clock oscillator further includes an integrated circuit (IC), and the disposing at least a part of a shock-absorbing material layer between a resonator and a base includes: disposing at least a part of the shock-absorbing material layer between the resonator and the IC, where the shock-absorbing material layer is in contact with a first surface of the IC, a second surface of the IC is in contact with a first surface of the base, and the first surface of the IC is opposite to the second surface of the IC.

In a possible implementation, the clock oscillator further includes an integrated circuit (IC), and the disposing at least a part of a shock-absorbing material layer between a resonator and a base includes: placing the resonator, the shock-absorbing material layer, and the IC on a first surface of the base, where the IC does not overlap the shock-absorbing material layer.

In a possible implementation, a packaging manner of the overall packaging includes vacuum packaging or plastic packaging.

In a possible implementation, before the disposing at least a part of a shock-absorbing material layer between a resonator and a base, the method further includes: performing vacuum packaging on the resonator.

In a possible implementation, when the resonator is a crystal resonator, the performing vacuum packaging on the resonator includes: performing surface mounted device (SMD) ceramic packaging on the crystal resonator; or when the resonator is a semiconductor resonator, the performing vacuum packaging on the resonator includes: performing wafer-level packaging on the semiconductor resonator. The resonator is packaged in advance, so that the shock-absorbing material layer can be disposed between the resonator and the base.

According to a third aspect, a method for obtaining a clock frequency is provided to obtain the clock frequency by using the clock oscillator in any one of the first aspect and the possible implementations of the first aspect.

According to a fourth aspect, a chip is provided. The chip includes the clock oscillator in any one of the first aspect and the possible implementations of the first aspect.

According to a fifth aspect, an electronic device is provided. The electronic device includes the clock oscillator in any one of the first aspect and the possible implementations of the first aspect.

In a possible implementation, the electronic device is a communications device or a network device.

According to a sixth aspect, an apparatus for obtaining a clock frequency is provided. The apparatus includes a clock oscillator, a shock-absorbing material layer, and a substrate, and at least a part of the shock-absorbing material layer is located between the clock oscillator and at least a part of the substrate.

In the apparatus, the shock-absorbing material layer is added between the clock oscillator and at least a part of the substrate, and the shock-absorbing material layer can effectively prevent a mechanical wave from being conducted between the substrate and the clock oscillator, so that the clock oscillator is protected from external vibration. This can ensure, when there is external vibration, that an output frequency of the clock oscillator is not deteriorated and improve shock absorption performance of the clock oscillator.

In a possible implementation, the shock-absorbing material layer includes a micron-level layer structure, a nanometer-level three-dimensional mesh structure, or a polymer material.

In a possible implementation, the nanometer-level three-dimensional mesh structure includes nanofibers.

In a possible implementation, the nanofibers include carbon nanofibers and/or ceramic nanofibers.

In a possible implementation, a structure of the shock-absorbing material layer includes a planar layer structure, the clock oscillator is located on a first side of the shock-absorbing material layer, at least a part of the substrate is located on a second side of the shock-absorbing material layer, and the second side of the shock-absorbing material layer is opposite to the first side of the shock-absorbing material layer.

In a possible implementation, the substrate is a flexible printed circuit (FPC), the FPC is U-shaped, a first part of the FPC is located on the first side of the shock-absorbing material layer, a second part of the FPC is located on the second side of the shock-absorbing material layer, and the first part of the FPC is located between the clock oscillator and the shock-absorbing material layer.

In a possible implementation, the planar layer structure includes a continuous planar layer structure, a planar grid layer structure, or a plurality of dotted structures in a same plane.

In a possible implementation, a structure of the shock-absorbing material layer includes a curved layer structure, and the shock-absorbing material layer fully or half surrounds the clock oscillator.

In a possible implementation, the curved layer structure includes a continuous curved layer structure or a curved grid layer structure.

In a possible implementation, the clock oscillator includes a resonator and an integrated circuit (IC), and the resonator is a crystal resonator or a semiconductor resonator.

In a possible implementation, the apparatus further includes a cover plate or a plastic packaging material, and the cover plate or the plastic packaging material is used to vacuum-package the clock oscillator.

In a possible implementation, the apparatus further includes a bonding wire, and the bonding wire is configured to electrically connect the clock oscillator and the substrate.

According to a seventh aspect, a production method for an apparatus for obtaining a clock frequency is provided. The method includes: disposing at least a part of a shock-absorbing material layer between a clock oscillator and at least a part of a substrate; and wholly packaging the clock oscillator and the shock-absorbing material layer to obtain the apparatus.

In the method, the shock-absorbing material layer is added between the clock oscillator and at least a part of the substrate, and the shock-absorbing material layer can effectively prevent a mechanical wave from being conducted between the substrate and the clock oscillator, so that the clock oscillator is protected from external vibration. This can ensure, when there is external vibration, that an output frequency of the clock oscillator is not deteriorated and improve shock absorption performance of the clock oscillator.

In a possible implementation, the shock-absorbing material layer includes a micron-level layer structure, a nanometer-level three-dimensional mesh structure, or a polymer material.

In a possible implementation, the nanometer-level three-dimensional mesh structure includes nanofibers.

In a possible implementation, the nanofibers include carbon nanofibers and/or ceramic nanofibers.

In a possible implementation, a structure of the shock-absorbing material layer includes a planar layer structure, and the disposing at least a part of a shock-absorbing material layer between a clock oscillator and at least a part of a substrate includes: disposing the clock oscillator on a first side of the shock-absorbing material layer; and disposing at least a part of the substrate on a second side of the shock-absorbing material layer, where the second side of the shock-absorbing material layer is opposite to the first side of the shock-absorbing material layer.

In a possible implementation, the substrate is a flexible printed circuit (FPC), the FPC is U-shaped, and the disposing at least a part of a shock-absorbing material layer between a clock oscillator and at least a part of a substrate includes: disposing a first part of the FPC on the first side of the shock-absorbing material layer; disposing a second part of the FPC on the second side of the shock-absorbing material layer; and disposing the first part of the FPC between the clock oscillator and the shock-absorbing material layer.

In a possible implementation, the planar layer structure includes a continuous planar layer structure, a planar grid layer structure, or a plurality of dotted structures in a same plane.

In a possible implementation, a structure of the shock-absorbing material layer includes a curved layer structure, and the disposing at least a part of a shock-absorbing material layer between a clock oscillator and at least a part of a substrate includes: using the shock-absorbing material layer to fully or half surround the clock oscillator.

In a possible implementation, the curved layer structure includes a continuous curved layer structure or a curved grid layer structure.

In a possible implementation, the clock oscillator includes a resonator and an integrated circuit (IC), and the resonator is a crystal resonator or a semiconductor resonator.

In a possible implementation, the wholly packaging the clock oscillator and the shock-absorbing material layer includes: vacuum-packaging the clock oscillator and the shock-absorbing material layer by using a cover plate or a plastic packaging material.

In a possible implementation, the method further includes: electrically connecting the clock oscillator and the substrate by using a bonding wire.

According to an eighth aspect, a method for obtaining a clock frequency is provided, to obtain the clock frequency by using the apparatus in any one of the sixth aspect and the possible implementations of the sixth aspect.

According to a ninth aspect, a chip is provided. The chip includes the apparatus in any one of the sixth aspect and the possible implementations of the sixth aspect.

According to a tenth aspect, an electronic device is provided. The electronic device includes the apparatus in any one of the possible implementations of the sixth aspect.

In a possible implementation, the electronic device is a communications device or a network device.

BRIEF DESCRIPTION OF DRAWINGS

To describe the solutions of the embodiments more clearly, the following briefly describes the accompanying drawings used in the embodiments. It is clear that the accompanying drawings in the following description merely show some embodiments, and a person of ordinary skill in the art can derive other solutions and accompanying drawings from these accompanying drawings without creative efforts.

DETAILED DESCRIPTION OF THE EMBODIMENTS

The following describes embodiments with reference to accompanying drawings.

Figure 1:
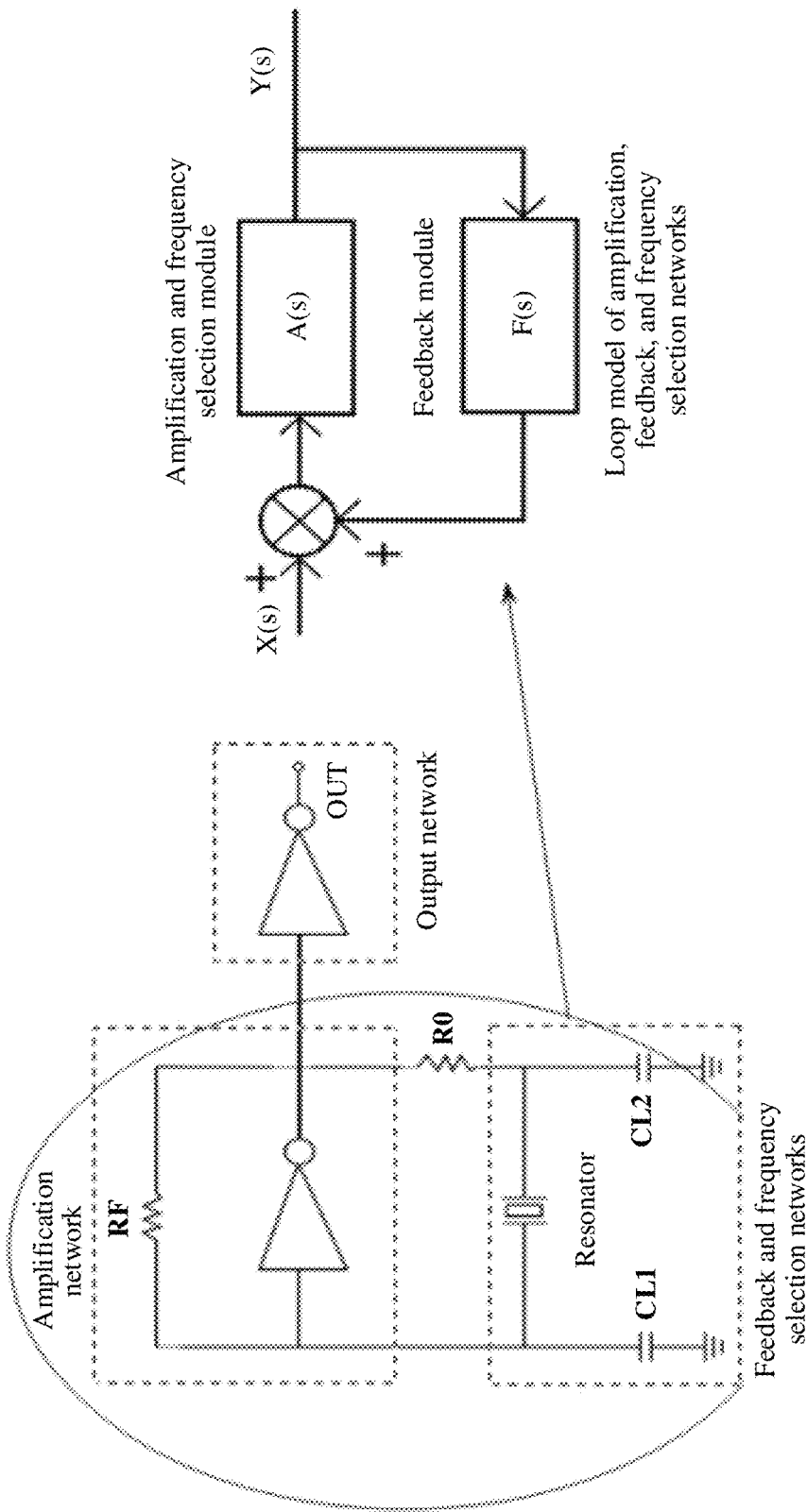
FIG. 1 is a schematic diagram of basic principles of a clock oscillator according to an embodiment.

FIG. 1 is a schematic diagram of basic principles of a clock oscillator. As shown on a left side of FIG. 1, the clock oscillator includes a resonator, a feedback network, a frequency selection network, an amplification network, and an output network. With reference to a loop model of amplification, feedback, and frequency selection networks on a right side of FIG. 1, the amplification network has a power gain. When the resonator starts, the amplification network operates in a linear area to amplify a noise signal or an input signal. Once the resonator oscillates regularly, the amplification network enters a non-linear state, and the loop gain decreases, to stabilize amplitude and a frequency. The frequency selection network performs selection from frequency signals output by the amplification network, so that a frequency signal of a selected frequency is output, and signals of other frequencies are suppressed. The feedback network feeds back, to an input end of the amplification network, the frequency signal that passes through the frequency selection network, so that a closed-loop positive feedback network is formed. The output network shapes and drives an amplified stable frequency signal for output to another component.

Depending on different types of the resonator, there may be different types of clock oscillators. A crystal oscillator and a semiconductor oscillator are two typical mechanical oscillators.

Figure 2:
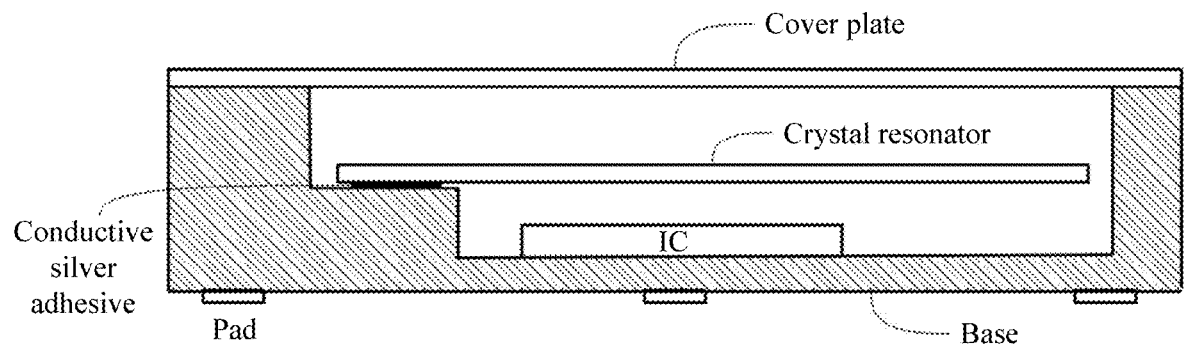
FIG. 2 is a schematic diagram of composition of a crystal oscillator according to an embodiment.

FIG. 2 is a schematic diagram of composition of a crystal oscillator. As shown in FIG. 2, the crystal oscillator includes a crystal resonator, and the crystal resonator is usually a thin slice cut from a quartz crystal at a specific azimuth angle and is also referred to as a crystal wafer. The crystal wafer has a half-suspended structure in the crystal oscillator. The crystal oscillator selects a frequency by using a resonance characteristic of the crystal wafer, to output a specific frequency signal. In addition to the crystal resonator, the crystal oscillator includes an integrated circuit (IC), a conductive silver adhesive, a base, and a cover plate.

In the crystal oscillator, a thickness of the crystal wafer is related to a fundamental frequency of the crystal wafer, and the fundamental frequency may also be referred to as a base frequency or an output frequency. Generally, a crystal wafer with a higher fundamental frequency is thinner. For example, a thickness of a crystal wafer whose fundamental frequency is 156.25 MHz is approximately 11 μm, a thickness of a crystal wafer whose fundamental frequency is 285 MHz is approximately 7 μm, and a thickness of a crystal wafer whose fundamental frequency is 500 MHz is approximately 3 μm.

In an actual product application, a clock oscillator with high-frequency and low-jitter performance is required in a high-speed analog-to-digital converter (ADC)/digital-to-analog converter (DAC). Currently, a crystal oscillator with a high fundamental frequency is a mainstream clock solution of the high-speed ADC/DAC, and therefore the foregoing micron-level crystal wafers are widely applied to these components.

However, a crystal wafer with a smaller thickness also has poorer shock absorption performance Generally, there is a theoretical relationship between an external stress and a fundamental frequency of a crystal wafer, as represented by formula (1):

$$\frac{\Delta f}{f} = K_F \frac{\text{(Force)(Frequency constant)}}{\text{(Diameter)(Thickness)}}, \text{where} \qquad (1)$$

$K_F$ is a constant factor, f is the fundamental frequency of the crystal wafer, Δf is a frequency error caused by vibration, Force is an external force acting on the crystal wafer, Frequency constant is a constant, Diameter is an equivalent diameter of the crystal wafer, and Thickness is a thickness of the crystal wafer. It can be learned from formula (1) that, under impact of a same external stress, when the thickness of the crystal wafer is smaller, the frequency error caused by vibration is larger, in other words, shock absorption performance of the crystal wafer is poorer. Therefore, when being affected by external vibration, the foregoing crystal wafer with a micron-level thickness is more prone to cause a frequency error. Therefore, performance is deteriorated, or even the crystal wafer is broken, causing a failure of an entire crystal oscillator.

However, during operation of the crystal oscillator, impact of external vibration is inevitable. For example, an ambient temperature change causes a stress of a printed circuit board (PCB) in an optical module of a communications device to be released to generate acoustic emission. A typical scenario is as follows: when a temperature changes, a crack is generated in a residual flux in a solder paste on the PCB during a temperature cycle. A crack generation and extension process is accompanied with acoustic emission, and the acoustic emission is usually high-frequency mechanical vibration with a frequency of approximately 200 KHz. As shown in FIG. 2, the crystal wafer is usually rigidly connected to the base, and the high-frequency mechanical vibration in the acoustic emission can be transferred to the crystal wafer. In addition, because the crystal wafer has a half-suspended structure, the high-frequency mechanical vibration causes the crystal wafer to be bent and deformed. Bending and deformation of the crystal wafer cause hopping of an output frequency of the crystal wafer, further leading to deterioration of system performance and a service bit error. In an actual production process, the crystal resonator frequency hopping and service bit error problems caused by the temperature change seriously affect product research, development, and production efficiency and product competitiveness.

Figure 3A:
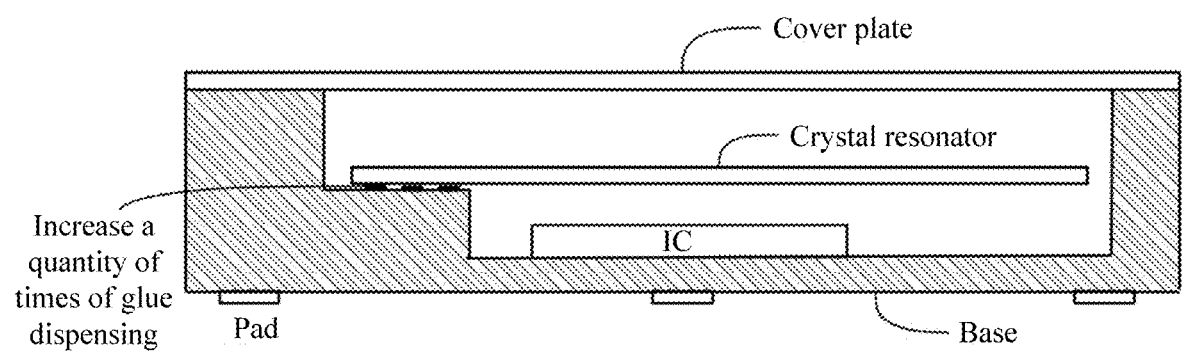
FIG. 3a is a schematic diagram of composition of a crystal oscillator according to an embodiment.

FIG. 3a is a schematic diagram of composition of a crystal oscillator. In the crystal oscillator, a quantity of times of glue dispensing of a conductive silver adhesive between a crystal wafer and a base increases, to absorb external vibration and improve shock absorption performance of the crystal oscillator. However, because the external vibration is a mechanical wave and is propagated depending on a rigid body, only by increasing the quantity of times of glue dispensing, an essence of a rigid connection between a crystal resonator and the base cannot be changed, the external high-frequency mechanical wave cannot be prevented from being propagated to the crystal resonator, and impact on the crystal oscillator that is caused by the external vibration cannot be effectively reduced.

Figure 3B:
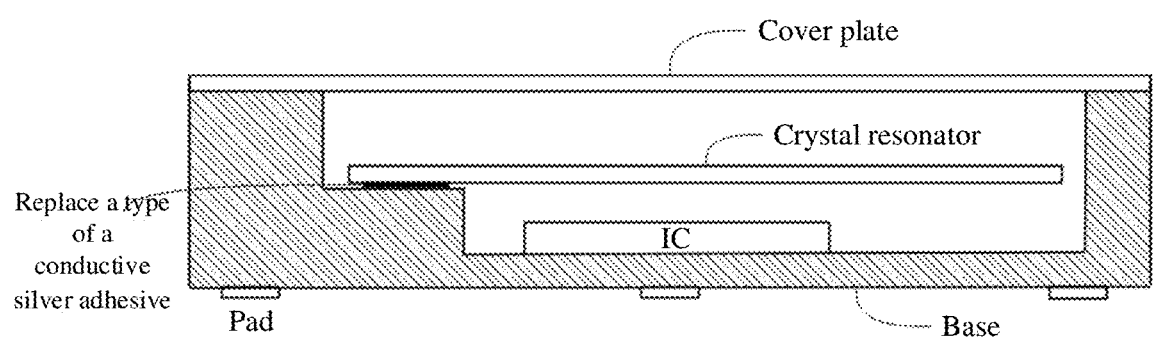
FIG. 3b is a schematic diagram of composition of a crystal oscillator according to an embodiment.

FIG. 3b is a schematic diagram of composition of a crystal oscillator. In the crystal oscillator, a type of a conductive silver adhesive between a crystal wafer and a base is replaced, to improve shock absorption performance of the crystal oscillator while ensuring a reliable connection between the base and the crystal wafer. However, similar to the crystal oscillator shown in FIG. 3a, because external vibration is a mechanical wave and is propagated depending on a rigid body, only by replacing the type of the conductive silver adhesive, an essence of a rigid connection between a crystal resonator and the base cannot be changed, the external high-frequency mechanical wave cannot be prevented from being propagated to the crystal resonator, and impact on the crystal oscillator that is caused by the external vibration cannot be effectively reduced.

Figure 3C:
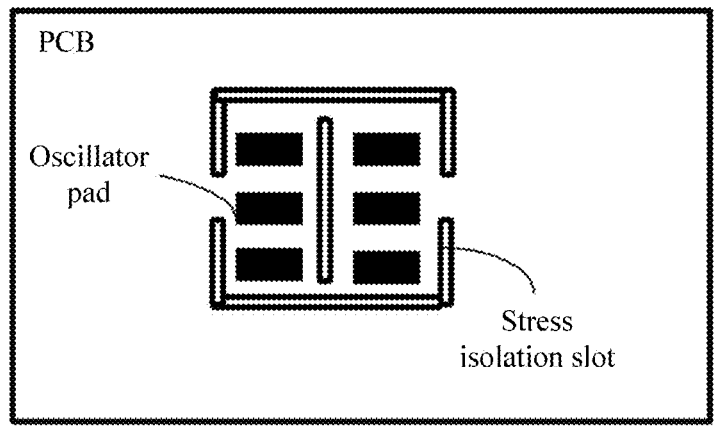
FIG. 3c is a schematic structural diagram of a PCB bearing a crystal oscillator according to an embodiment.

FIG. 3c is a schematic structural diagram of a PCB bearing a crystal oscillator. As shown in FIG. 3c, oscillator pads for welding and fastening the crystal oscillator are disposed on the PCB, and a stress isolation slot is disposed around these oscillator pads, so that a stress generated by thermal expansion and contraction of the PCB can be damped to some extent. However, such a stress isolation slot cannot isolate all external vibration, for example, high-frequency vibration generated by a flux crack in soldering tin of the crystal oscillator pad during a temperature cycle.

Figure 4A:
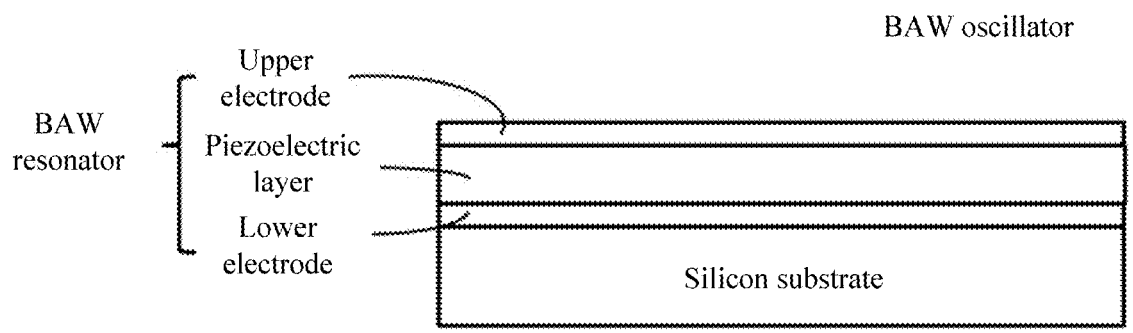
FIG. 4a is a schematic diagram of composition of a semiconductor resonator according to an embodiment.
Figure 4B:
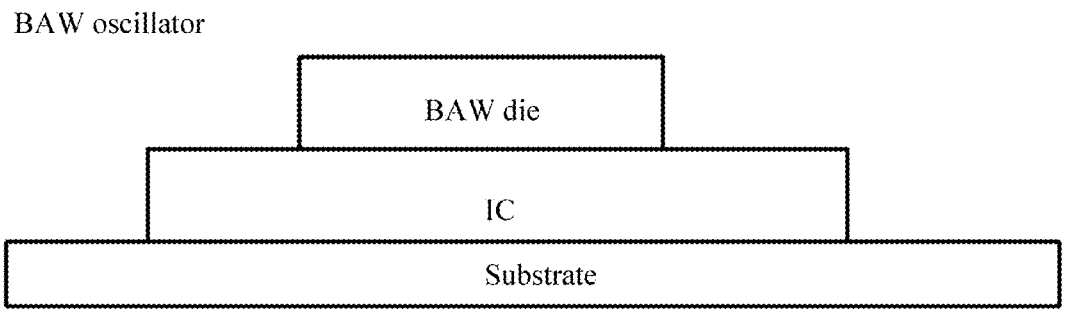
FIG. 4b is a schematic diagram of composition of a semiconductor oscillator according to an embodiment.

A semiconductor oscillator is another important type of clock oscillator. Compared with the crystal oscillator, a resonator in the semiconductor oscillator is a micron-nanometer structure produced based on a semiconductor process, and therefore is also referred to as a semiconductor resonator. A semiconductor resonator in a micron range usually also belongs to a micro-electromechanical systems (MEMS) resonator. FIG. 4a is a schematic diagram of composition of a semiconductor resonator. FIG. 4b shows a semiconductor oscillator including the semiconductor resonator. As shown in FIG. 4a, the semiconductor resonator is a bulk acoustic wave (BAW) resonator, and includes an upper electrode, a lower electrode, a piezoelectric material layer, and a substrate. The piezoelectric material layer is sandwiched between the upper electrode and the lower electrode, and a whole of the three is placed on the substrate. Optionally, an acoustic mirror may be further disposed between the lower electrode and the substrate. As shown in FIG. 4b, the BAW resonator is connected to an IC circuit and a substrate to form a BAW oscillator. The BAW oscillator is a type of semiconductor oscillator. Basic principles of the BAW oscillator are as follows: An electrical signal is converted into an acoustic wave by using an electroacoustic transducer (not shown in FIG. 4a) for transfer in the piezoelectric material layer. The acoustic wave is reflected and resonated in the piezoelectric material, and finally, the acoustic wave is converted into an electrical signal with a high frequency to form an oscillating signal.

It should be noted that the semiconductor oscillator in the embodiments may be various types of semiconductor oscillators, including but not limited to the BAW oscillator shown in FIG. 4b. Another type of semiconductor oscillator, for example, a silicon MEMS oscillator, is also applicable to the embodiments.

The semiconductor oscillator is less affected by external vibration than the crystal oscillator. However, when external vibration is transferred to the semiconductor resonator, the semiconductor resonator may still be bent and deformed, and hopping of an output frequency of the semiconductor resonator may be caused, causing deterioration of system performance and a service bit error. However, currently, there is no effective and reliable solution in the industry without introducing performance costs and making a production procedure more complex.

Therefore, how to improve shock absorption performance of the clock oscillator is a problem that urgently needs to be resolved.

The embodiments provide a clock oscillator. The clock oscillator includes a resonator, a shock-absorbing material layer, and a base, and at least a part of the shock-absorbing material layer is located between the resonator and the base. In the clock oscillator, the shock-absorbing material layer is added between the resonator and the base, and the shock-absorbing material layer can convert mechanical wave energy into thermal energy through deformation of the shock-absorbing material layer, to effectively prevent a mechanical wave from being conducted between the base and the resonator, so that the resonator is protected from external vibration. This can ensure, when there is external vibration, that an output frequency of the resonator is not deteriorated and improve shock absorption performance of the clock oscillator.

The clock oscillator provided in the embodiments may be a crystal oscillator or may be a semiconductor oscillator.

Figure 5A:
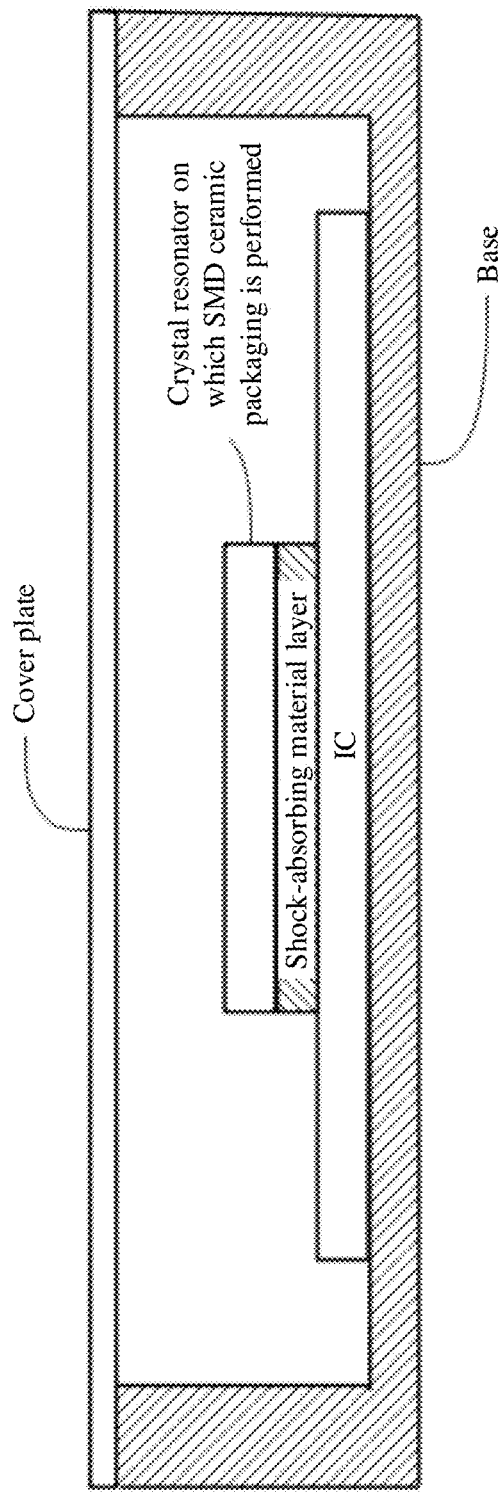
FIG. 5a is a schematic diagram of composition of a crystal oscillator according to an embodiment.

FIG. 5a shows a crystal oscillator according to an embodiment. The crystal oscillator includes a crystal resonator, a shock-absorbing material layer, and a base, and at least a part of the shock-absorbing material layer is located between the crystal resonator and the base. An electrical connection or signal interworking can be implemented between the crystal resonator and the base. In addition, the crystal oscillator may further include a pad, configured to implement an electrical connection to or signal interworking with an external component. A quantity of pads is not limited. The shock-absorbing material layer can effectively improve shock absorption performance of a clock oscillator, and also ensure reliability and small-size packaging of the entire oscillator. For example, a shock absorber material selected for the shock-absorbing material layer has one or more of the following characteristics: (1) being capable of forming an ultra-thin layer structure of a micron-nanometer level, to minimize an increase in a component thickness; (2) being super-elastic to achieve high wave absorption efficiency; (3) being fatigue-resistant, to be capable of deforming repeatedly without causing irreversible deformation; (4) being heat-resistant, to avoid trait deterioration during long-term operation at a high temperature; and (5) with high strength to be not prone to tear and be impact-resistant.

Impact on the overall component thickness that is caused by adding the shock-absorbing material layer is an important consideration. Currently, a height of a crystal oscillator with a high fundamental frequency is approximately 1.05 mm. To avoid seriously affecting the component thickness, a thickness of a finally obtained shock-absorbing material layer is preferably at a micron level, for example, less than hundreds of microns. Carbon nanotubes and graphene are used as examples. Although the two materials have a super-elastic attribute and thermal mechanical stability, involved devices and production processes are complex, only materials with a size of a millimeter level can be currently obtained, and an overall thickness of the clock oscillator is greatly increased when the materials are applied to the shock-absorbing material layer in this embodiment.

Optionally, the shock absorber material may be a polymer material. The polymer material may be a highly elastic polymer material with reversible deformation polymer material that is highly elastic with reversible deformation, for example, silica gel or rubber. Polymer materials are easy to process, can be manufactured on a large scale, and are cost-effective.

Optionally, in this embodiment, the shock absorber material selected for the shock-absorbing material layer may have a micron-level layer structure or may have a nanometer-level three-dimensional mesh structure. Materials of the two structures can form a shock-absorbing material layer with a thickness of tens of microns to hundreds of microns, to achieve high shock absorption performance with a quite small thickness and ensure small-size packaging. In addition, the materials of the two structures have both high strength and high toughness, and therefore a difficulty that a material of a conventional structure can hardly have high strength and high toughness is overcome, and reliability is ensured. In addition, the materials of the two structures can be produced by using a large-scale biological material synthesis method. This is cost-effective and supports large-scale manufacturing.

Optionally, the shock absorber material selected for the shock-absorbing material layer may be a carbon nanofiber material or may be a ceramic nanofiber material. These nanofiber materials can ensure reliability and small-size packaging while improving a shock absorption capability of the clock oscillator.

Figure 5B:
FIG. 5b is a schematic structural diagram of a crystal resonator on which SMD ceramic packaging is performed according to an embodiment.

Optionally, in the crystal oscillator, vacuum packaging may be performed on the crystal resonator in advance, so that the shock-absorbing material layer can be added. A manner of the vacuum packaging may be surface mounted device (SMD) ceramic packaging. FIG. 5b is a schematic structural diagram of a crystal resonator on which SMD ceramic packaging is performed. The crystal resonator has a half-suspended structure and is bonded to an SMD ceramic packaging housing by using a conductive silver adhesive. Optionally, the crystal resonator on which SMD ceramic vacuum packaging is performed can meet general size specifications of various existing crystal resonators. For example, a packaging size of the crystal resonator on which SMD ceramic vacuum packaging is performed may be differential SMD3225 or single-end SMD2520.

Optionally, surfaces that are of the crystal resonator and the shock-absorbing material layer and that are in contact with each other are bonded, to implement a close connection between the crystal resonator and the shock-absorbing material layer.

Optionally, the crystal oscillator further includes an integrated circuit (IC). An electrical connection or signal interworking can be implemented between the IC and the base.

Figure 5C:
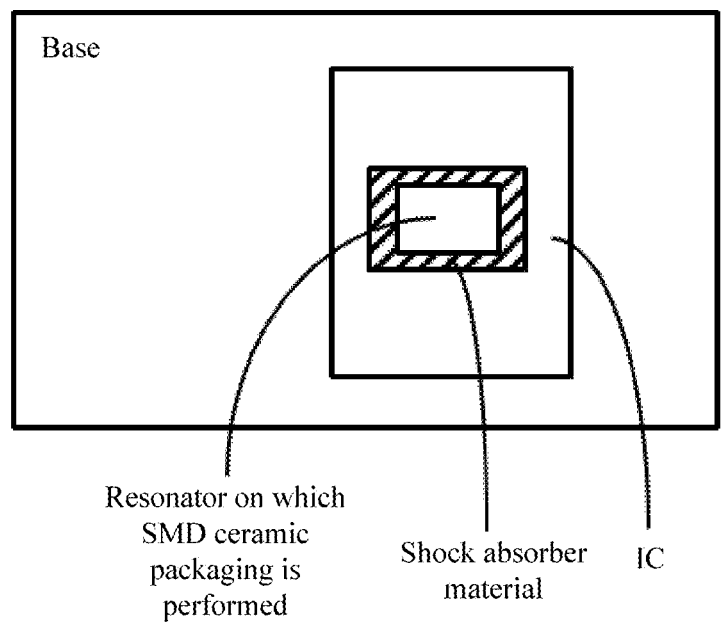
FIG. 5c is a schematic diagram of composition of a crystal oscillator according to an embodiment.

Optionally, at least a part of the shock-absorbing material layer is located between the IC and the resonator, the shock-absorbing material layer is in contact with a first surface of the IC, a second surface of the IC is in contact with a first surface of the base, and the first surface of the IC is opposite to the second surface of the IC. In other words, the crystal resonator and the IC are stacked. In this case, a side view of the crystal oscillator is shown in FIG. 5a, and a top view of the crystal oscillator is shown in FIG. 5c.

Figure 5D:
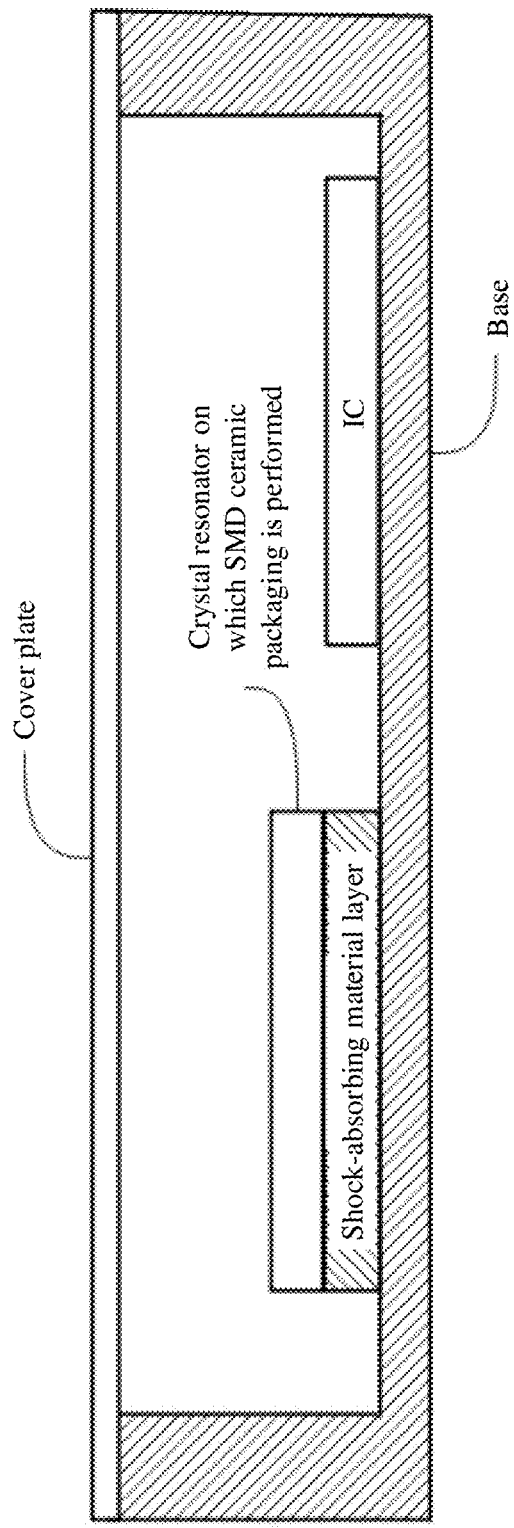
FIG. 5d is a schematic diagram of composition of a crystal oscillator according to an embodiment.
Figure 5E:
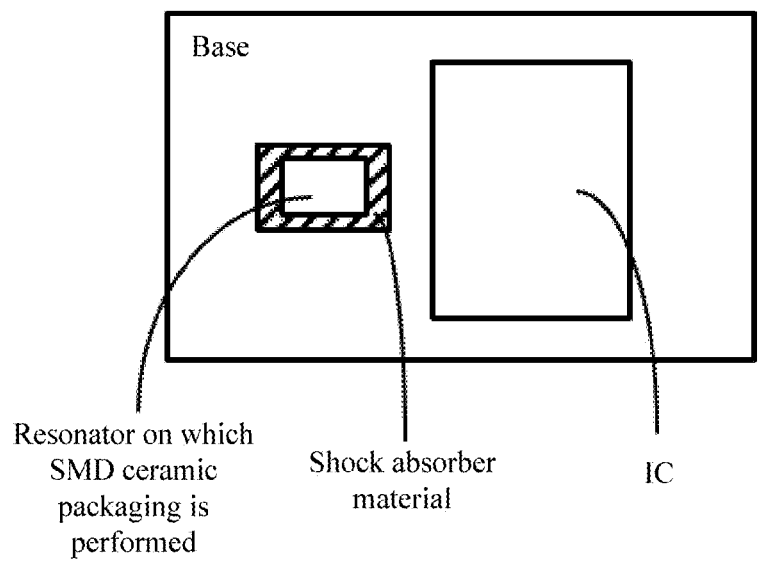
FIG. 5e is a schematic diagram of composition of a crystal oscillator according to an embodiment.

Optionally, both the shock-absorbing material layer and the IC are in contact with a first surface of the base, and the IC does not overlap the shock-absorbing material layer. In other words, the crystal resonator is placed in parallel with the IC. In this case, a side view of the crystal oscillator is shown in FIG. 5d, and a top view of the crystal oscillator is shown in FIG. 5e.

Optionally, a structure of the shock-absorbing material layer may be a layer structure.

Figure 5F:
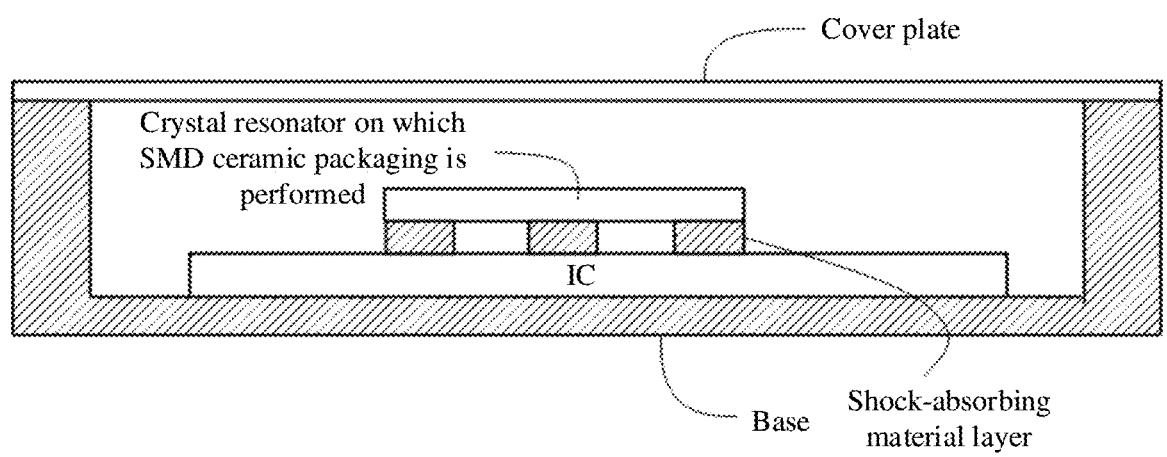
FIG. 5f is a schematic diagram of composition of a crystal oscillator according to an embodiment.

Optionally, a structure of the shock-absorbing material layer may be a planar layer structure. In this case, as shown in FIG. 5a and FIG. 5d, the crystal resonator is located on a first side of the shock-absorbing material layer, the base is located on a second side of the shock-absorbing material layer, and the second side of the shock-absorbing material layer is opposite to the first side of the shock-absorbing material layer. The planar layer structure includes but is not limited to a continuous planar layer structure, a planar grid layer structure, or a plurality of dotted structures in a same plane. As shown in FIG. 5f, when the structure of the shock-absorbing material layer is a planar grid layer structure or a plurality of dotted structures in a same plane, the shock-absorbing material layer can still effectively prevent a mechanical wave from being conducted between the base and the resonator, so that the resonator is protected from external vibration.

Figure 6:
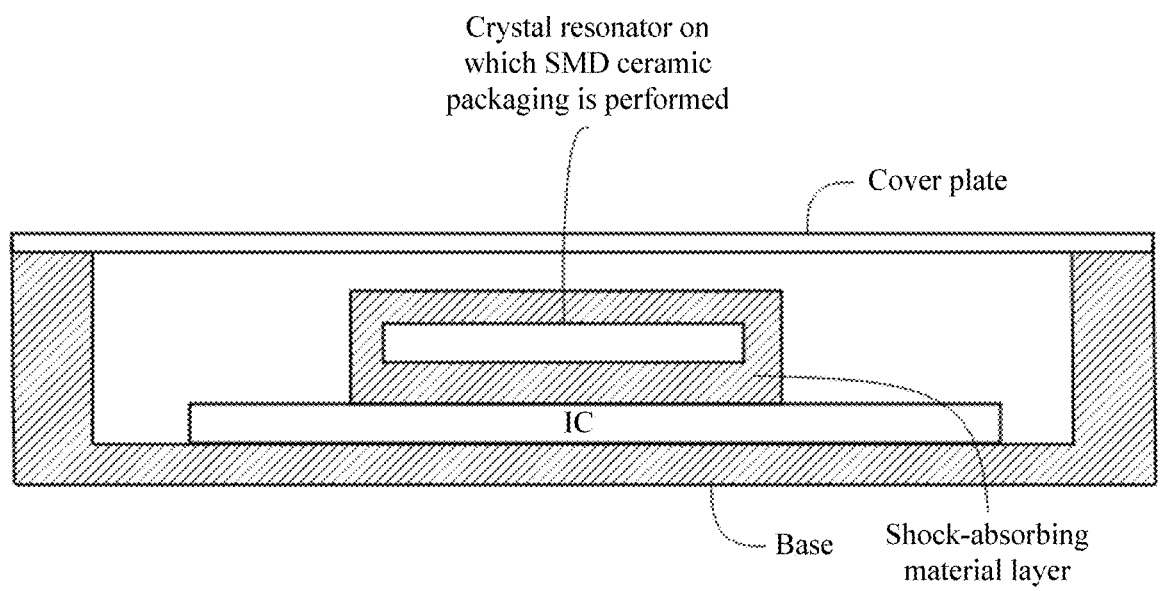
FIG. 6 is a schematic diagram of composition of a crystal oscillator according to an embodiment.

Optionally, a structure of the shock-absorbing material layer may be a curved layer structure. In this case, as shown in FIG. 6, the shock-absorbing material layer fully or half surrounds the crystal resonator. The curved layer structure includes but is not limited to a continuous curved layer structure or a curved grid layer structure.

Figure 7A:
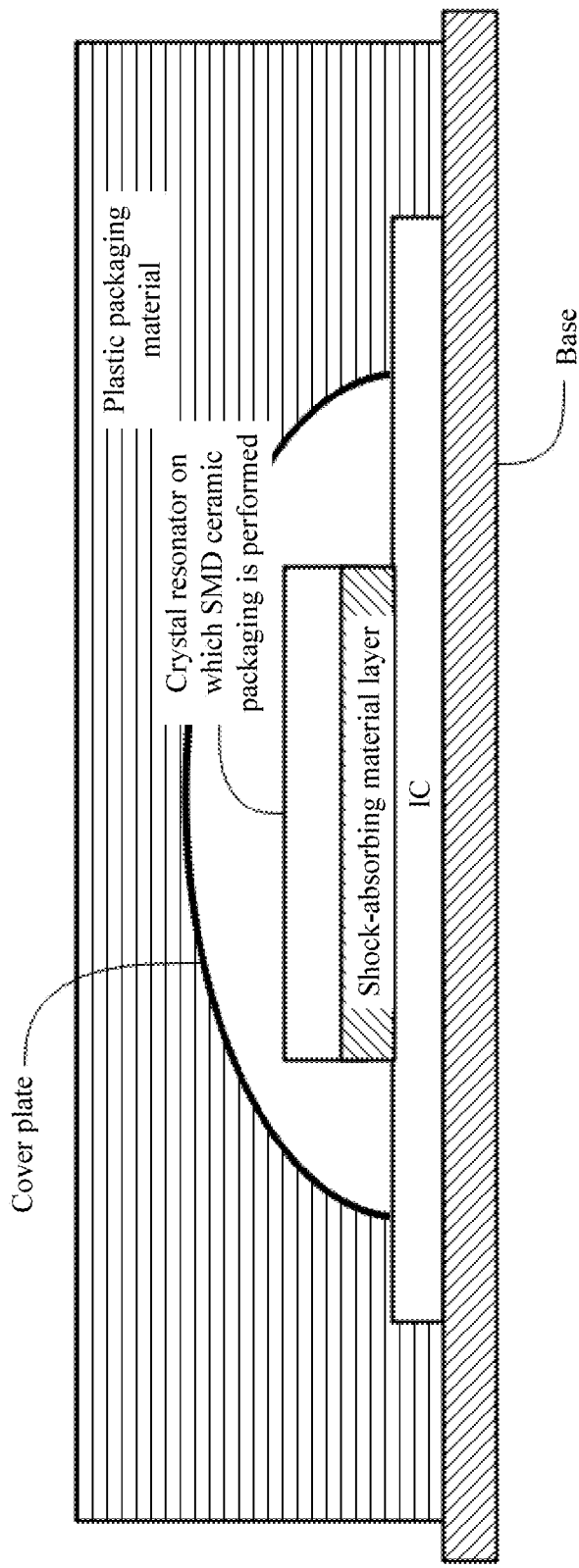
FIG. 7a is a schematic diagram of composition of a crystal oscillator according to an embodiment.
Figure 7B:
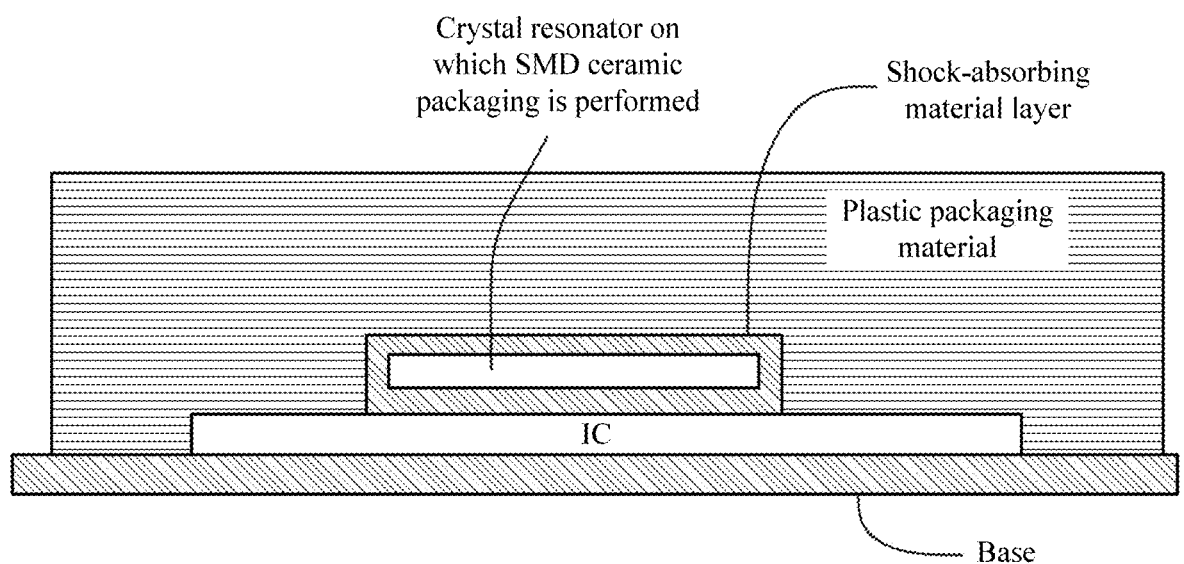
FIG. 7b is a schematic diagram of composition of a crystal oscillator according to an embodiment.

Optionally, overall packaging is performed on the crystal resonator and the shock-absorbing material layer to obtain the crystal oscillator. A manner of the overall packaging may be vacuum packaging or plastic packaging. For example, FIG. 5a, FIG. 5d, FIG. 5f, and FIG. 6 each show a vacuum packaging manner. In this vacuum packaging manner, the crystal resonator, the shock-absorbing material layer, and the IC are placed on the ceramic base, and are covered by a metal cover plate. For another example, FIG. 7a shows another vacuum packaging manner. In this vacuum packaging manner, at least a part of the shock-absorbing material layer is located between the IC and the resonator, and the shock-absorbing material layer is in contact with a first surface of the IC, a second surface of the IC is in contact with a first surface of the base, the first surface of the IC is opposite to the second surface of the IC, and the first surface of the base is covered by an arc-shaped cover plate and is further packaged by using a resin material. It should be noted that in the vacuum packaging manner shown in FIG. 7a, alternatively, the shock-absorbing material layer may be in contact with a first surface of the base, the IC may be in contact with the first surface of the base, and the IC does not overlap the shock-absorbing material layer. A specific diagram is not provided herein. For another example, FIG. 7b shows a plastic packaging manner. In this plastic packaging manner, the shock-absorbing material layer fully surrounds the crystal resonator, the shock-absorbing material layer is in contact with a first surface of the IC, a second surface of the IC is in contact with a first surface of the base, and the first surface of the IC is opposite to the second surface of the IC. In other words, the shock-absorbing material layer and the crystal resonator overlap the IC and then the three are further placed on the base. The first surface of the base is further packaged by using a plastic packaging material. It should be noted that in the vacuum packaging manner shown in FIG. 7b, alternatively, the shock-absorbing material layer may be in contact with a first surface of the base, the IC may be in contact with the first surface of the base, and the IC does not overlap the shock-absorbing material layer. A specific diagram is not provided herein.

Figure 8A:
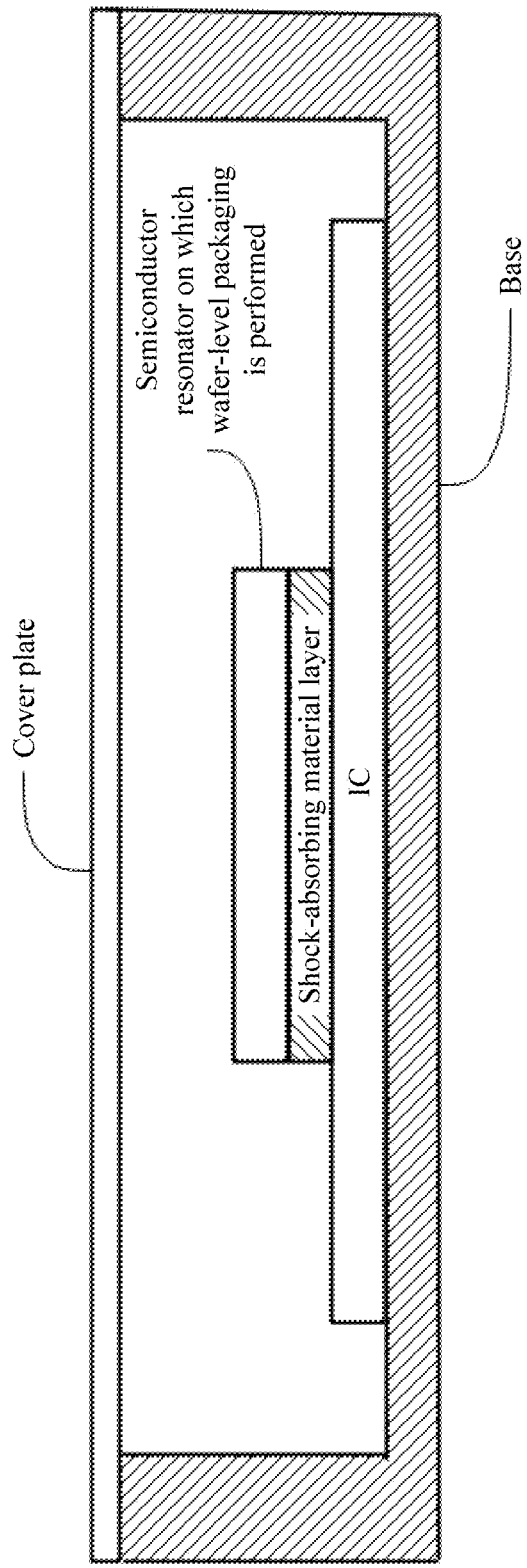
FIG. 8a is a schematic diagram of composition of a semiconductor oscillator according to an embodiment.

FIG. 8a shows a semiconductor oscillator according to an embodiment. The semiconductor oscillator includes a semiconductor resonator, a shock-absorbing material layer, and a base, and at least a part of the shock-absorbing material layer is located between the semiconductor resonator and the base. An electrical connection or signal interworking can be implemented between the semiconductor resonator and the base. In addition, the semiconductor oscillator may further include a pad, configured to implement an electrical connection or signal interworking with an external component. A quantity of pads is not limited. A performance requirement and a specific type of a shock absorber material selected for the shock-absorbing material layer are the same as those of the foregoing crystal oscillator, and details are not described herein again.

Optionally, the semiconductor resonator may be a BAW resonator, a MEMS resonator, or another type of semiconductor resonator.

Optionally, in the semiconductor oscillator, wafer-level packaging may be performed on the semiconductor resonator in advance.

Optionally, surfaces that are of the semiconductor resonator and the shock-absorbing material layer and that are in contact with each other are bonded, to implement a close connection between the semiconductor resonator and the shock-absorbing material layer.

Optionally, the semiconductor oscillator further includes an IC. An electrical connection or signal interworking can be implemented between the IC and the base.

Optionally, at least a part of the shock-absorbing material layer is located between the IC and the resonator, the shock-absorbing material layer is in contact with a first surface of the IC, a second surface of the IC is in contact with a first surface of the base, and the first surface of the IC is opposite to the second surface of the IC. In other words, the semiconductor resonator and the IC are stacked. In this case, the semiconductor oscillator is shown in FIG. 8a.

Figure 8B:
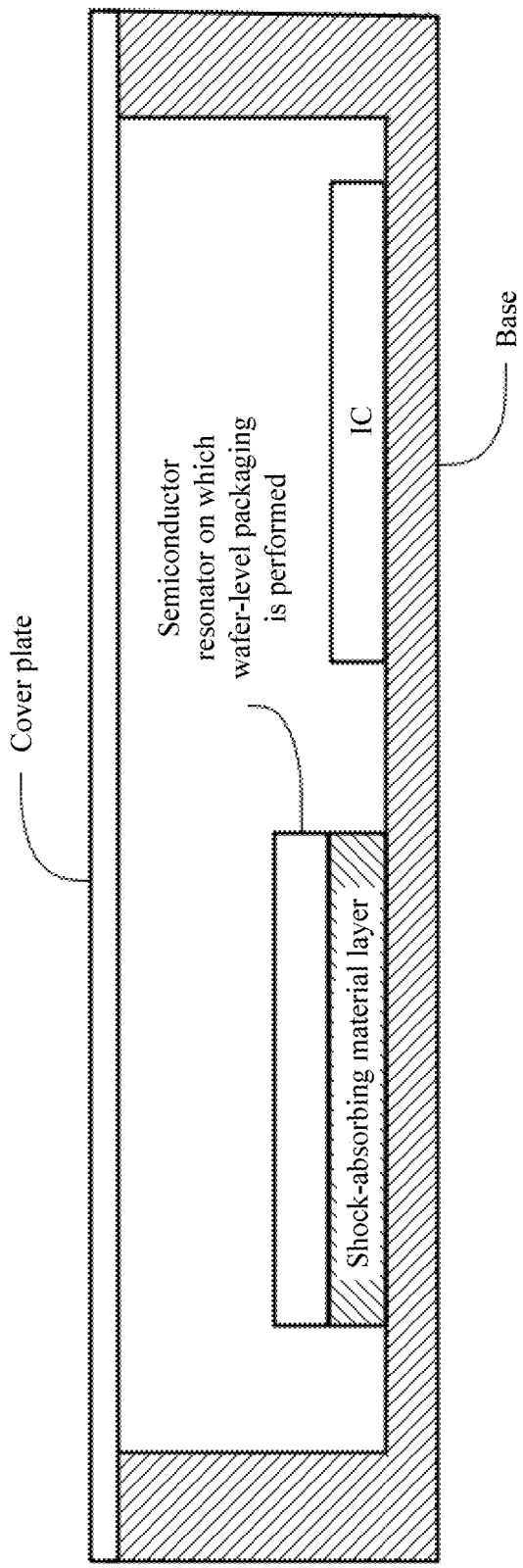
FIG. 8b is a schematic diagram of composition of a semiconductor oscillator according to an embodiment.

Optionally, both the shock-absorbing material layer and the IC are in contact with a first surface of the base, and the IC does not overlap the shock-absorbing material layer. In other words, the semiconductor resonator is placed in parallel with the IC. In this case, the semiconductor oscillator is shown in FIG. 8b.

Figure 9A:
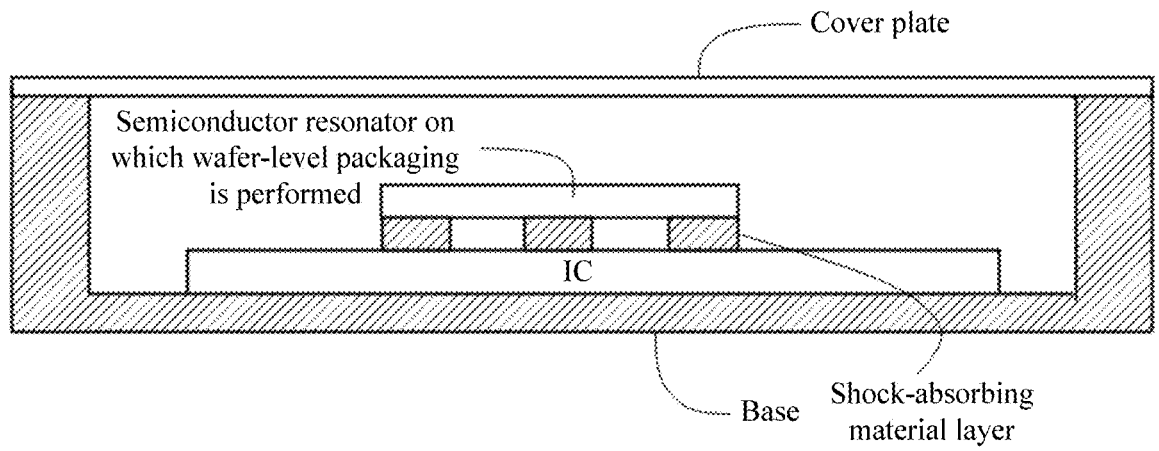
FIG. 9a is a schematic diagram of composition of a semiconductor oscillator according to an embodiment.
Figure 9B:
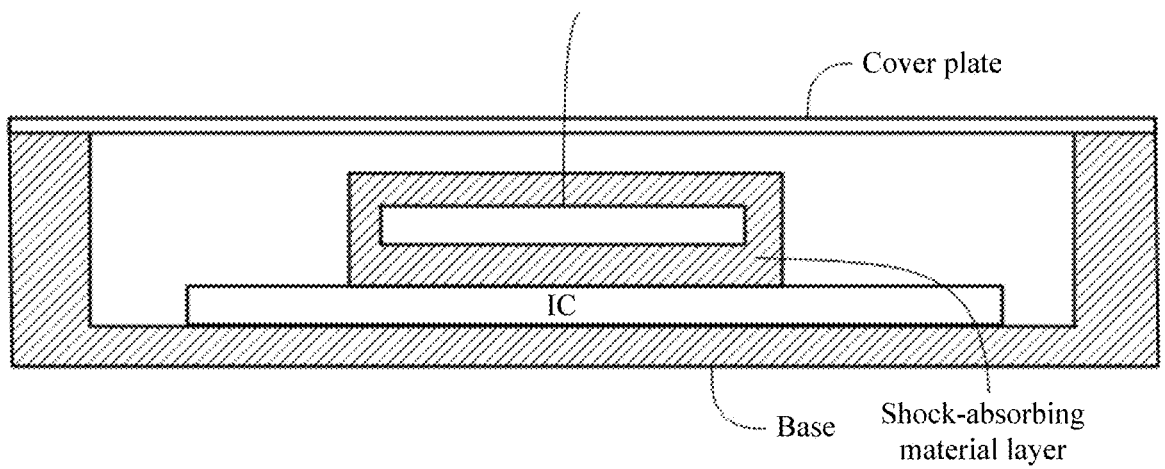
FIG. 9b is a schematic diagram of composition of a semiconductor oscillator according to an embodiment.

Optionally, a structure of the shock-absorbing material layer in the semiconductor oscillator is the same as that in the foregoing crystal oscillator and may be a layer structure. Further, the layer structure may be a planar layer structure or a curved layer structure. Details are not described herein again. FIG. 8a and FIG. 8b show semiconductor oscillators using a shock-absorbing material layer of a continuous planar layer structure. FIG. 9a shows a semiconductor oscillator using a shock-absorbing material layer of a planar mesh layer structure or a plurality of dotted structures in a same plane. FIG. 9b shows a semiconductor oscillator using a shock-absorbing material layer of a curved layer structure.

Figure 10A:
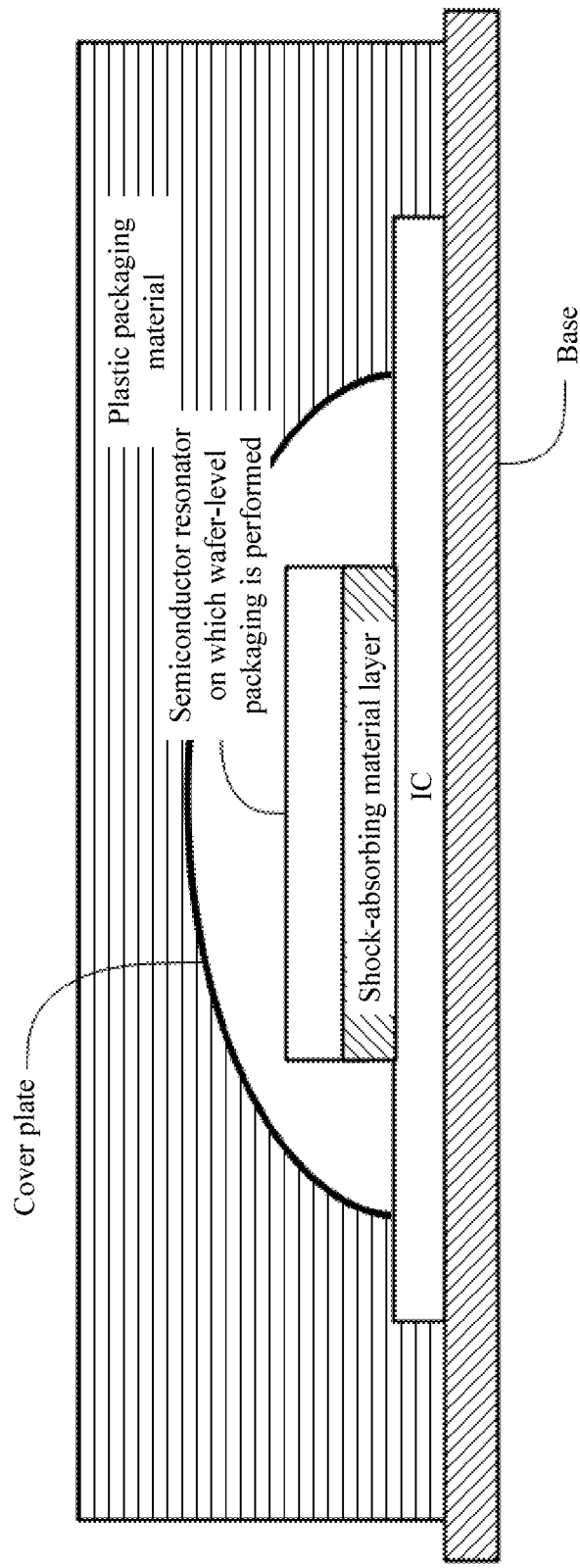
FIG. 10a is a schematic diagram of composition of a semiconductor oscillator according to an embodiment.
Figure 10B:
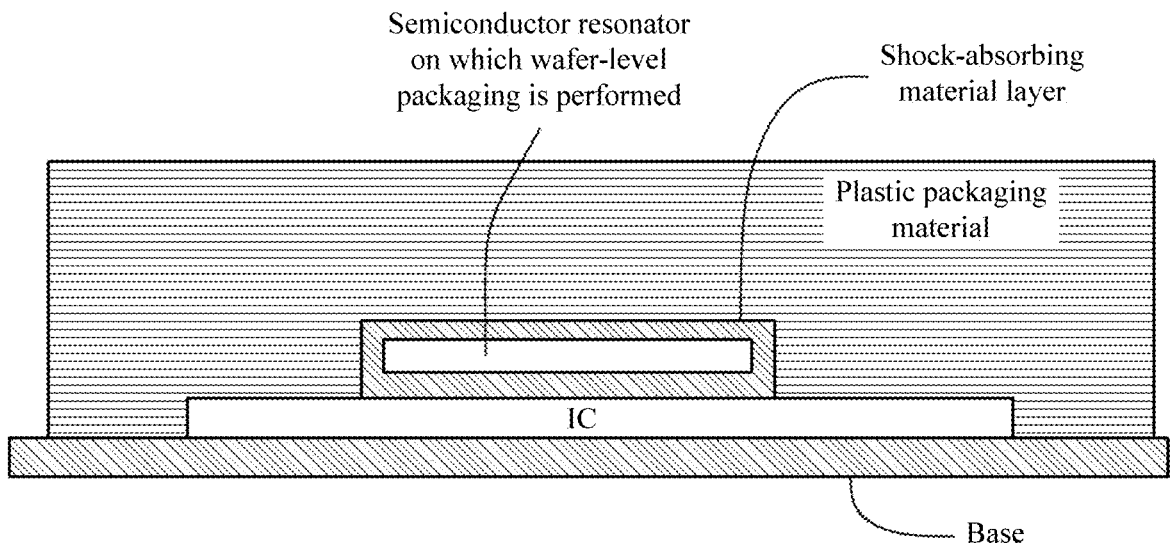
FIG. 10b is a schematic diagram of composition of a semiconductor oscillator according to an embodiment.

Optionally, overall packaging is performed on the semiconductor resonator and the shock-absorbing material layer to obtain the semiconductor oscillator. A manner of the overall packaging may be vacuum packaging or plastic packaging. For example, FIG. 8a, FIG. 8b, FIG. 9a, and FIG. 9b each show a vacuum packaging manner. In this vacuum packaging manner, the semiconductor resonator, the shock-absorbing material layer, and the IC are placed on the ceramic base, and are covered by a metal cover plate. For another example, FIG. 10a shows another vacuum packaging manner. In this vacuum packaging manner, at least a part of the shock-absorbing material layer is located between the IC and the resonator, and the shock-absorbing material layer is in contact with a first surface of the IC, a second surface of the IC is in contact with a first surface of the base, the first surface of the IC is opposite to the second surface of the IC, and the first surface of the base is covered by an arc-shaped cover plate and is further packaged by using a resin material. It should be noted that in the vacuum packaging manner shown in FIG. 10a, alternatively, the shock-absorbing material layer may be in contact with a first surface of the base, the IC may be in contact with the first surface of the base, and the IC does not overlap the shock-absorbing material layer. A specific diagram is not provided herein. For another example, FIG. 10b shows a plastic packaging manner. In this plastic packaging manner, the shock-absorbing material layer fully surrounds the semiconductor resonator, the shock-absorbing material layer is in contact with a first surface of the IC, a second surface of the IC is in contact with a first surface of the base, and the first surface of the IC is opposite to the second surface of the IC. In other words, the shock-absorbing material layer and the semiconductor resonator overlap the IC and then the three are further placed on the base. The first surface of the base is further packaged by using a plastic packaging material. It should be noted that in the vacuum packaging manner shown in FIG. 10b, alternatively, the shock-absorbing material layer may be in contact with a first surface of the base, the IC may be in contact with the first surface of the base, and the IC does not overlap the shock-absorbing material layer. A specific diagram is not provided herein.

Optionally, in the foregoing crystal oscillator and semiconductor oscillator, an electrode in the crystal resonator obtained after vacuum packaging may be led out through wiring, or an electrode in the semiconductor resonator obtained after wafer-level packaging may be led out through wiring.

A crystal oscillator in an optical module of a communications device is used as an example. Through an actual on-board test, it can be found that a bit error rate of the optical module is more than 10% when no shock-absorbing material layer is added, and there can be almost no bit error after a shock-absorbing material layer is added. Therefore, using the clock oscillator provided in the embodiments can greatly improve a shock absorption capability of the clock oscillator, improve a product production process, and improve product competitiveness. In addition, reliability and small-size packaging can be ensured while a shock absorption capability of the clock oscillator is improved.

Figure 11:
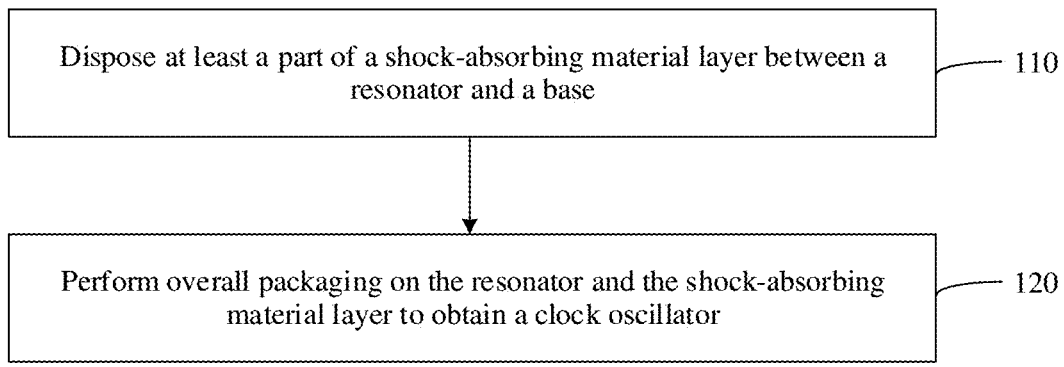
FIG. 11 is a flowchart of a clock oscillator production method according to an embodiment.

An embodiment provides a clock oscillator production method. In the method, a shock-absorbing material layer is added between a resonator and a base, and the shock-absorbing material layer can convert mechanical wave energy into thermal energy through deformation of the shock-absorbing material layer, to effectively prevent a mechanical wave from being conducted between the base and the resonator, so that the resonator is protected from external vibration. This can ensure, when there is external vibration, that an output frequency of the resonator is not deteriorated and improve shock absorption performance of a clock oscillator. As shown in FIG. 11, the method includes steps S110 and S120.

S110. Dispose at least a part of the shock-absorbing material layer between the resonator and the base.

S120. Perform overall packaging on the oscillator and the shock-absorbing material layer to obtain the clock oscillator.

The clock oscillator may be a crystal oscillator or may be a semiconductor oscillator.

A performance requirement, a specific type, and a structure of a shock absorber material selected for the shock-absorbing material layer are the same as those in the foregoing embodiment, and details are not described herein again.

A packaging manner of the overall packaging is the same as that in the foregoing embodiment, and details are not described herein again.

Optionally, when a structure of the shock-absorbing material layer includes a planar layer structure, the disposing at least a part of the shock-absorbing material layer between the resonator and the base includes: placing the resonator on a first side of the shock-absorbing material layer; and placing the base on a second side of the shock-absorbing material layer, where the second side of the shock-absorbing material layer is opposite to the first side of the shock-absorbing material layer.

Optionally, when a structure of the shock-absorbing material layer is a curved layer structure, the disposing at least a part of the shock-absorbing material layer between the resonator and the base includes: using the shock-absorbing material layer to fully or half surround the resonator.

Optionally, a structure of the shock-absorbing material layer is a curved layer structure, and the disposing at least a part of the shock-absorbing material layer between the resonator and the base includes: using the shock-absorbing material layer to fully or half surround the resonator.

Optionally, the disposing at least a part of the shock-absorbing material layer between the resonator and the base includes: bonding surfaces of the resonator and the shock-absorbing material layer.

Optionally, the clock oscillator further includes an integrated circuit (IC), and the disposing at least a part of the shock-absorbing material layer between the resonator and the base includes: disposing at least a part of the shock-absorbing material layer between the resonator and the IC, where the shock-absorbing material layer is in contact with a first surface of the IC, a second surface of the IC is in contact with a first surface of the base, and the first surface of the IC is opposite to the second surface of the IC.

Optionally, the clock oscillator further includes an integrated circuit (IC), and the disposing at least a part of the shock-absorbing material layer between the resonator and the base includes: placing the resonator, the shock-absorbing material layer, and the IC on a first surface of the base, where the IC does not overlap the shock-absorbing material layer.

Optionally, before the disposing at least a part of the shock-absorbing material layer between the resonator and the base, the method further includes:

performing vacuum packaging on the resonator.

Manners of performing vacuum packaging on the crystal resonator and the semiconductor resonator are the same as those in the foregoing embodiment, and details are not described herein again.

An embodiment provides a method for obtaining a clock frequency. In the method, a stable and high-performance clock frequency is obtained by using the clock oscillator in the foregoing embodiment.

An embodiment provides a chip. The chip includes the clock oscillator in the foregoing embodiment.

An embodiment provides an electronic device. The electronic device includes the clock oscillator in the foregoing embodiment. For example, the electronic device may be a communications device or a network device such as a router, a switch, or another forwarding device, or the electronic device may be a computer device such as a personal computer or a server, or the electronic device may be a communications terminal device such as a mobile phone or a wearable intelligent device.

In addition, an embodiment provides an apparatus for obtaining a clock frequency. The apparatus includes a clock oscillator, a shock-absorbing material layer, and a substrate, and at least a part of the shock-absorbing material layer is located between the clock oscillator and at least a part of the substrate. In the apparatus, the shock-absorbing material layer is added between the clock oscillator and at least a part of the substrate, and the shock-absorbing material layer can effectively prevent a mechanical wave from being conducted between the substrate and the clock oscillator, so that the clock oscillator is protected from external vibration. This can ensure, when there is external vibration, that an output frequency of the clock oscillator is not deteriorated and improve shock absorption performance of the clock oscillator.

Figure 12A:
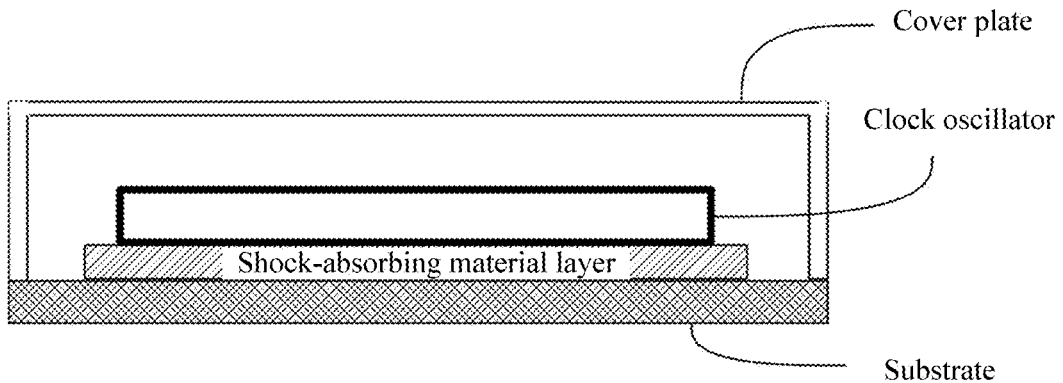
FIG. 12a is a schematic diagram of composition of an apparatus for obtaining a clock frequency according to an embodiment.
Figure 12B:
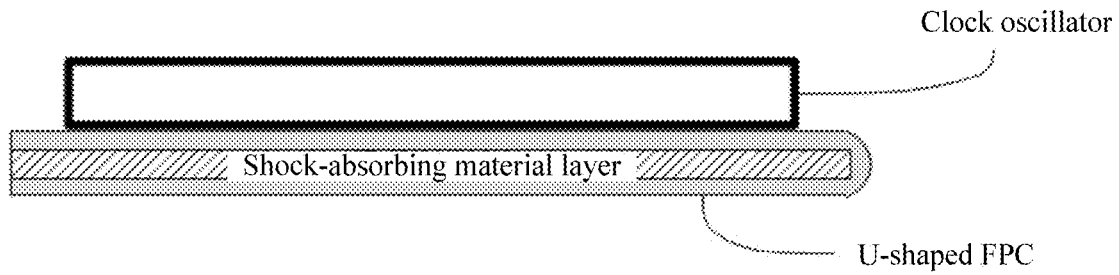
FIG. 12b is a schematic diagram of composition of an apparatus for obtaining a clock frequency according to an embodiment.
Figure 12C:
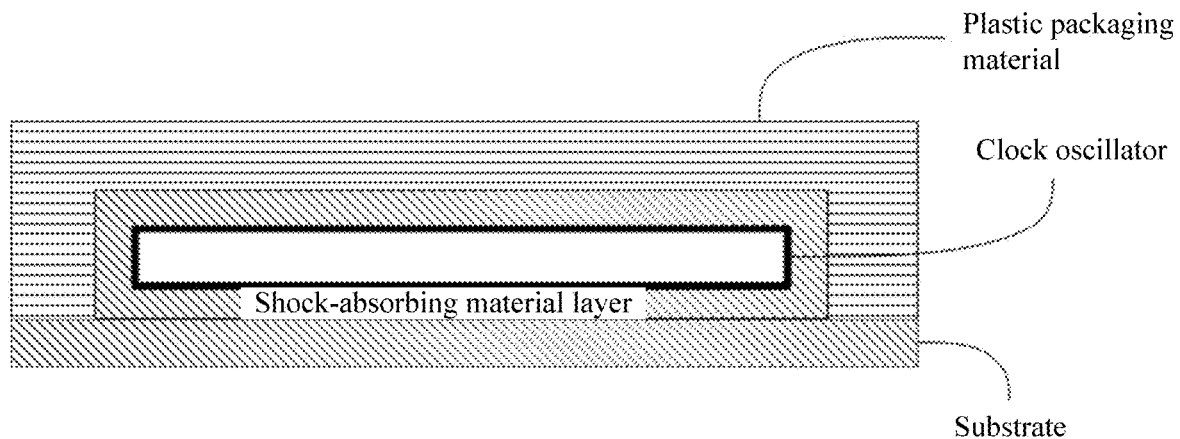
FIG. 12c is a schematic diagram of composition of an apparatus for obtaining a clock frequency according to an embodiment.

FIG. 12a to FIG. 12c show an apparatus for obtaining a clock frequency according to an embodiment. The apparatus includes a clock oscillator, a shock-absorbing material layer, and a substrate, and at least a part of the shock-absorbing material layer is located between the clock oscillator and at least a part of the substrate. An electrical connection or signal interworking can be implemented between the clock oscillator and the substrate. For example, the clock oscillator may be electrically connected to the substrate by using a bonding wire (not shown in the figure). Optionally, a pad may be disposed on the substrate, and a quantity of pads is not limited.

Optionally, the apparatus further includes a cover plate (shown in FIG. 12a) or a plastic packaging material (shown in FIG. 12c), and the cover plate or the plastic packaging material is used to vacuum-package the clock oscillator.

Optionally, a structure of the shock-absorbing material layer may be a planar layer structure. In this case, as shown in FIG. 12a, the clock oscillator is located on a first side of the shock-absorbing material layer, the substrate is located on a second side of the shock-absorbing material layer, and the second side of the shock-absorbing material layer is opposite to the first side of the shock-absorbing material layer. The planar layer structure includes but is not limited to a continuous planar layer structure, a planar grid layer structure, or a plurality of dotted structures in a same plane.

Optionally, the substrate may be a flexible printed circuit (FPC). The FPC may be U-shaped. As shown in FIG. 12b, a first part of the FPC is located on the first side of the shock-absorbing material layer, a second part of the FPC is located on the second side of the shock-absorbing material layer, and the first part of the FPC is located between the clock oscillator and the shock-absorbing material layer. In other words, the shock-absorbing material layer is filled between an upper surface and a lower surface of the U-shaped FPC that are parallel. In this case, when there is external vibration, the shock-absorbing material layer sandwiched between the upper surface and the lower surface of the FPC that are parallel can convert mechanical wave energy into thermal energy through deformation of the shock-absorbing material layer, to effectively prevent a mechanical wave from being conducted between the substrate and the clock oscillator, so that the clock oscillator is protected from the external vibration.

Optionally, the clock oscillator and the FPC may be bonded by using a conductive silver adhesive or welded by using a solder paste.

Optionally, a structure of the shock-absorbing material layer may be a curved layer structure. In this case, as shown in FIG. 12c, the shock-absorbing material layer fully or half surrounds the clock oscillator. The curved layer structure includes but is not limited to a continuous curved layer structure or a curved grid layer structure.

For the structure of the shock-absorbing material layer, refer to the structure in the foregoing embodiment. For example, the planar layer structure includes a continuous planar layer structure, a planar grid layer structure, or a plurality of dotted structures in a same plane, and the curved layer structure includes a continuous curved layer structure or a curved grid layer structure. Details are not described herein again.

A shock absorber material selected for the shock-absorbing material layer may be the shock absorber material provided in the foregoing embodiment, and details are not described herein again.

The clock oscillator may be the clock oscillator provided in the foregoing embodiment. The clock oscillator includes a resonator and an integrated circuit (IC). The resonator is a crystal resonator or a semiconductor resonator, for example, the clock oscillator shown in FIG. 2, FIG. 3a, FIG. 3b, FIG. 5a, FIG. 5d, FIG. 5d, FIG. 6, FIG. 7a, FIG. 7b, FIG. 8a, FIG. 8b, FIG. 9a, FIG. 9b, FIG. 10a, or FIG. 10b. Details are not described herein again.

Figure 13:
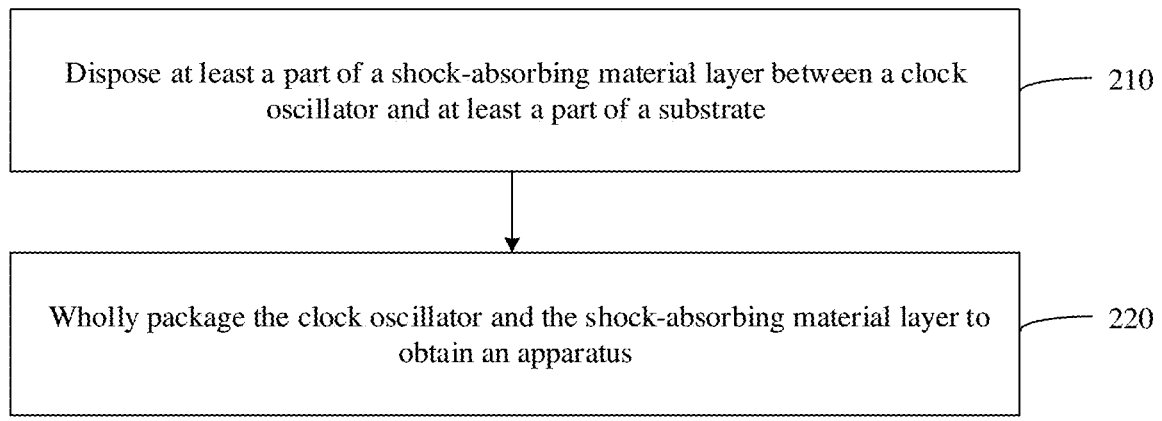
FIG. 13 is a flowchart of a production method for an apparatus for obtaining a clock frequency according to an embodiment.

An embodiment provides a production method for an apparatus for obtaining a clock frequency. In the method, a shock-absorbing material layer is added between a clock oscillator and a substrate, and the shock-absorbing material layer can convert mechanical wave energy into thermal energy through deformation of the shock-absorbing material layer, to effectively prevent a mechanical wave from being conducted between the clock oscillator and the substrate, so that the clock oscillator is protected from external vibration. This can ensure, when there is external vibration, that an output frequency of the clock oscillator is not deteriorated and improve shock absorption performance of the clock oscillator. As shown in FIG. 13, the method includes steps S210 and S220.

S210. Dispose at least a part of the shock-absorbing material layer between the clock oscillator and at least a part of the substrate.

S220. Wholly package the clock oscillator and the shock-absorbing material layer to obtain the apparatus.

Optionally, a structure of the shock-absorbing material layer includes a planar layer structure, and the disposing at least a part of the shock-absorbing material layer between the clock oscillator and at least a part of the substrate includes:

disposing the clock oscillator on a first side of the shock-absorbing material layer; and disposing at least a part of the substrate on a second side of the shock-absorbing material layer, where the second side of the shock-absorbing material layer is opposite to the first side of the shock-absorbing material layer.

Optionally, the substrate is a flexible printed circuit (FPC), the FPC is U-shaped, and the disposing at least a part of the shock-absorbing material layer between the clock oscillator and at least a part of the substrate includes:

disposing a first part of the FPC on the first side of the shock-absorbing material layer;

disposing a second part of the FPC on the second side of the shock-absorbing material layer; and disposing the first part of the FPC between the clock oscillator and the shock-absorbing material layer.

Optionally, a structure of the shock-absorbing material layer includes a curved layer structure, and the disposing at least a part of the shock-absorbing material layer between the clock oscillator and at least a part of the substrate includes:

using the shock-absorbing material layer to fully or half surround the clock oscillator.

Optionally, the method further includes:

electrically connecting the clock oscillator and the substrate by using a bonding wire.

A shock absorber material selected for the shock-absorbing material layer may be the shock absorber material provided in the foregoing embodiment, and details are not described herein again.

The clock oscillator may be the clock oscillator provided in the foregoing embodiment, for example, the clock oscillator shown in FIG. 2, FIG. 3a, FIG. 3b, FIG. 5a, FIG. 5d, FIG. 5d, FIG. 6, FIG. 7a, FIG. 7b, FIG. 8a, FIG. 8b, FIG. 9a, FIG. 9b, FIG. 10a, or FIG. 10b. Details are not described herein again.

A manner of wholly packaging is the same as that in the foregoing embodiment, and details are not described herein again. For example, the wholly packaging the clock oscillator and the shock-absorbing material layer includes:

vacuum-packaging the clock oscillator and the shock-absorbing material layer by using a cover plate or a plastic packaging material.

An embodiment provides a method for obtaining a clock frequency. In the method, a stable and high-performance clock frequency is obtained by using the apparatus in the foregoing embodiment.

An embodiment provides a chip. The chip includes the apparatus for obtaining a clock frequency in the foregoing embodiment.

An embodiment provides an electronic device. The electronic device includes the apparatus for obtaining a clock frequency in the foregoing embodiment. For example, the electronic device may be a communications device or a network device such as a router, a switch, or another forwarding device, or the electronic device may be a computer device such as a personal computer or a server, or the electronic device may be a communications terminal device such as a mobile phone or a wearable intelligent device.

In the embodiments, the terms "first", "second", and the like are used to distinguish between same or similar items whose effects and functions are basically the same. It should be understood that there is no logical or time-sequence dependency between "first", "second", and "nth", and a quantity and an execution sequence are not limited, either. It should also be understood that although terms such as first and second are used in the following description to describe various elements, these elements should not be limited by the terms. These terms are merely used to distinguish one element from another element. For example, without departing from the scope of the various examples, a first image may also be referred to as a second image, and similarly, a second image may be referred to as a first image. Both the first image and the second image may be images, and in some cases, may be separate and different images.

It should further be understood that sequence numbers of the foregoing processes do not mean execution sequences in various embodiments. The execution sequences of the processes should be determined based on functions and internal logic of the processes and should not be construed as any limitation on the implementation processes of the embodiments.

It should be understood that the terms used in the descriptions of the various examples are merely intended to describe specific examples but are not intended to constitute a limitation. The terms "one" ("a" and "an") and "the" of singular forms used in the descriptions of the various examples and the appended claims are also intended to include plural forms, unless otherwise specified in the context clearly.

It should be understood that the term "and/or" used indicates and includes any or all possible combinations of one or more items in associated listed items. The term "and/or" describes an association relationship for describing associated objects and represents that three relationships may exist. For example, A and/or B may represent the following three cases: only A exists, both A and B exist, and only B exists. In addition, the character "I" usually indicates an "or" relationship between the associated objects.

It should further be understood that the term "includes" (also referred to as "includes", "including", "comprises", and/or "comprising") used specifies presence of the stated features, integers, steps, operations, elements, and/or components, with presence or addition of one or more other features, integers, steps, operations, elements, components, and/or their components not excluded.

It should be further understood that the term "if" may be interpreted as a meaning "when" ("when" or "upon"), "in response to determining", or "in response to detecting". Similarly, according to the context, the phrase "if it is determined that" or "if (a stated condition or event) is detected" may be interpreted as a meaning of "when it is determined that" or "in response to determining" or "when (a stated condition or event) is detected" or "in response to detecting (a stated condition or event)".

It should further be understood that "one embodiment", "an embodiment", or "a possible implementation" means that particular features, structures, or characteristics related to the embodiments or implementations are included in at least one embodiment. Therefore, "in one embodiment", "in an embodiment", or "in a possible implementation" does not necessarily refer to a same embodiment. In addition, these particular features, structures, or characteristics may be combined in one or more embodiments in any appropriate manner.

The foregoing descriptions are merely optional implementations of the embodiments, but are not limiting. Any modification or replacement readily figured out by a person of ordinary skill in the art within the scope disclosed in the embodiments shall fall within the scope of the embodiments.

What is claimed is:

1. An apparatus for obtaining a clock frequency, comprising: a clock oscillator, a shock-absorbing material layer, and a substrate, and at least a part of the shock-absorbing material layer is located between the clock oscillator and at least a part of the substrate,
   wherein the substrate is a flexible printed circuit (FPC), the FPC is U-shaped, a first part of the FPC is located on the first side of the shock-absorbing material layer, a second part of the FPC is located on the second side of the shock-absorbing material layer, and the first part of the FPC is located between the clock oscillator and the shock-absorbing material layer.

2. The apparatus according to claim 1, wherein the shock-absorbing material layer comprises a micron-level layer structure, a nanometer-level three-dimensional mesh structure, or a polymer material.

3. The apparatus according to claim 2, wherein the nanometer-level three-dimensional mesh structure comprises nanofibers.

4. The apparatus according to claim 3, wherein the nanofibers comprise carbon nanofibers and/or ceramic nanofibers.

5. The apparatus according to claim 1, wherein a structure of the shock-absorbing material layer comprises a planar layer structure, the clock oscillator is located on a first side of the shock-absorbing material layer, at least a part of the substrate is located on a second side of the shock-absorbing material layer, and the second side of the shock-absorbing material layer is opposite to the first side of the shock-absorbing material layer.

6. The apparatus according to claim 5, wherein the planar layer structure comprises a continuous planar layer structure, a planar grid layer structure, or a plurality of dotted structures in a same plane.

7. The apparatus according to claim 1, wherein a structure of the shock-absorbing material layer comprises a curved layer structure, and the shock-absorbing material layer fully or half surrounds the clock oscillator.

8. The apparatus according to claim 7, wherein the curved layer structure comprises a continuous curved layer structure or a curved grid layer structure.

9. The apparatus according to claim 1, wherein the clock oscillator comprises a resonator and an integrated circuit (IC), and the resonator is a crystal resonator or a semiconductor resonator.

10. The apparatus according to claim 1, wherein the apparatus further comprises a cover plate or a plastic packaging material, and the cover plate or the plastic packaging material is used to vacuum-package the clock oscillator.

11. The apparatus according to claim 1, wherein the apparatus further comprises a bonding wire, and the bonding wire is configured to electrically connect the clock oscillator and the substrate.

12. A production method for an apparatus for obtaining a clock frequency, comprising:

disposing at least a part of a shock-absorbing material layer between a clock oscillator and at least a part of a substrate; and wholly packaging the clock oscillator and the shock-absorbing material layer to obtain the apparatus, wherein the substrate is a flexible printed circuit (FPC), the FPC is U-shaped, and the disposing of at least a part of a shock-absorbing material layer between a clock oscillator and at least a part of a substrate comprises:

disposing a first part of the FPC on the first side of the shock-absorbing material layer;

disposing a second part of the FPC on the second side of the shock-absorbing material layer; and disposing the first part of the FPC between the clock oscillator and the shock-absorbing material layer.

13. The method according to claim 12, wherein the shock-absorbing material layer comprises a micron-level layer structure, a nanometer-level three-dimensional mesh structure, or a polymer material.

14. The method according to claim 13, wherein the nanometer-level three-dimensional mesh structure comprises nanofibers.

15. The method according to claim 14, wherein the nanofibers comprise carbon nanofibers and/or ceramic nanofibers.

16. The method according to claim 12, wherein a structure of the shock-absorbing material layer comprises a planar layer structure, and the disposing of at least a part of a shock-absorbing material layer between a clock oscillator and at least a part of a substrate comprises:

disposing the clock oscillator on a first side of the shock-absorbing material layer; and disposing at least a part of the substrate on a second side of the shock-absorbing material layer, wherein the second side of the shock-absorbing material layer is opposite to the first side of the shock-absorbing material layer.

17. The method according to claim 16, wherein the planar layer structure comprises a continuous planar layer structure, a planar grid layer structure, or a plurality of dotted structures in a same plane.

18. The method according to claim 12, wherein a structure of the shock-absorbing material layer comprises a curved layer structure, and the disposing of at least a part of a shock-absorbing material layer between a clock oscillator and at least a part of a substrate comprises:

using the shock-absorbing material layer to fully or half surround the clock oscillator.

19. The method according to claim 18, wherein the curved layer structure comprises a continuous curved layer structure or a curved grid layer structure.

20. The apparatus according to claim 12, wherein the clock oscillator comprises a resonator and an integrated circuit (IC), and the resonator is a crystal resonator or a semiconductor resonator.

21. The method according to claim 12, wherein the wholly packaging of the clock oscillator and the shock-absorbing material layer comprises:

vacuum-packaging the clock oscillator and the shock-absorbing material layer by using a cover plate or a plastic packaging material.

22. The method according to claim 12, further comprising:

electrically connecting the clock oscillator and the substrate by using a bonding wire.

23. A method for obtaining a clock frequency, comprising: obtaining the clock frequency by using an apparatus, wherein the apparatus comprises a clock oscillator, a shock-absorbing material layer, and a substrate, and at least a part of the shock-absorbing material layer is located between the clock oscillator and at least a part of the substrate, and wherein the substrate is a flexible printed circuit (FPC), the FPC is U-shaped, a first part of the FPC is located on the first side of the shock-absorbing material layer, a second part of the FPC is located on the second side of the shock-absorbing material layer, and the first part of the FPC is located between the clock oscillator and the shock-absorbing material layer.

24. An electronic device, comprising: an apparatus, wherein the apparatus comprises a clock oscillator, a shock-absorbing material layer, and a substrate, and at least a part of the shock-absorbing material layer is located between the clock oscillator and at least a part of the substrate, wherein the substrate is a flexible printed circuit (FPC), the FPC is U-shaped, a first part of the FPC is located on the first side of the shock-absorbing material layer, a second part of the FPC is located on the second side of the shock-absorbing material layer, and the first part of the FPC is located between the clock oscillator and the shock-absorbing material layer.

25. The electronic device according to claim 24, wherein the electronic device is a communications device or a network device.

* * * * *